US006254767B1

(12) United States Patent
Shin et al.

(10) Patent No.: US 6,254,767 B1
(45) Date of Patent: Jul. 3, 2001

(54) SEMICONDUCTOR DEVICE MANUFACTURING APPARATUS HAVING CONTROLLER DETECTING FUNCTION OF FILTER

(75) Inventors: Sung-ki Shin, Pusan; Sang-rok Hah, Seoul, both of (KR)

(73) Assignee: Samsung Electronics Co., Ltd., Suwon (KR)

(*) Notice: Subject to any disclaimer, the term of this patent is extended or adjusted under 35 U.S.C. 154(b) by 0 days.

(21) Appl. No.: 09/496,949

(22) Filed: Feb. 3, 2000

(30) Foreign Application Priority Data

Feb. 9, 1999 (KR) .................................................. 99-4427

(51) Int. Cl.[7] .................................................. B01D 17/12
(52) U.S. Cl. .......................... 210/85; 210/138; 210/167; 210/258; 417/42; 417/293; 451/60; 451/446
(58) Field of Search ................................. 210/85, 86, 87, 210/167, 194, 195.1, 257.1, 258, 416.1, 97, 138, 143; 451/60, 446; 417/42, 44.9, 293, 44.2; 340/679

(56) References Cited

U.S. PATENT DOCUMENTS

| 5,755,614 | * | 5/1998 | Adams et al. ........................ 451/60 |
| 5,925,240 | * | 7/1999 | Wilkins et al. .................... 210/195.1 |
| 5,993,647 | * | 11/1999 | Huang et al. .......................... 210/87 |
| 6,105,829 | * | 8/2000 | Snodgrass et al. .................. 222/214 |
| 6,183,341 | * | 2/2001 | Melcer ................................... 451/60 |
| 6,190,565 | * | 2/2001 | Bailey et al. ........................ 210/767 |

* cited by examiner

Primary Examiner—Joseph W. Drodge
(74) Attorney, Agent, or Firm—Jones Volentine, PLLC

(57) ABSTRACT

A semiconductor device manufacturing apparatus. The semiconductor device manufacturing apparatus includes: a tank having an inlet and an outlet, for storing a chemical solution; a pump interposed between the inlet and outlet of the tank, for circulating the chemical solution contained in the tank; a filter interposed between the pump and the inlet of the tank; at least one main body connected to an outlet of the filter; a pumping cycle sensor for changing the pumping operation of the pump into a pulse signal; and a controller for measuring the cycle time of the pulse signals generated by the pumping cycle sensor to determine the level of deterioration of the filter.

36 Claims, 9 Drawing Sheets

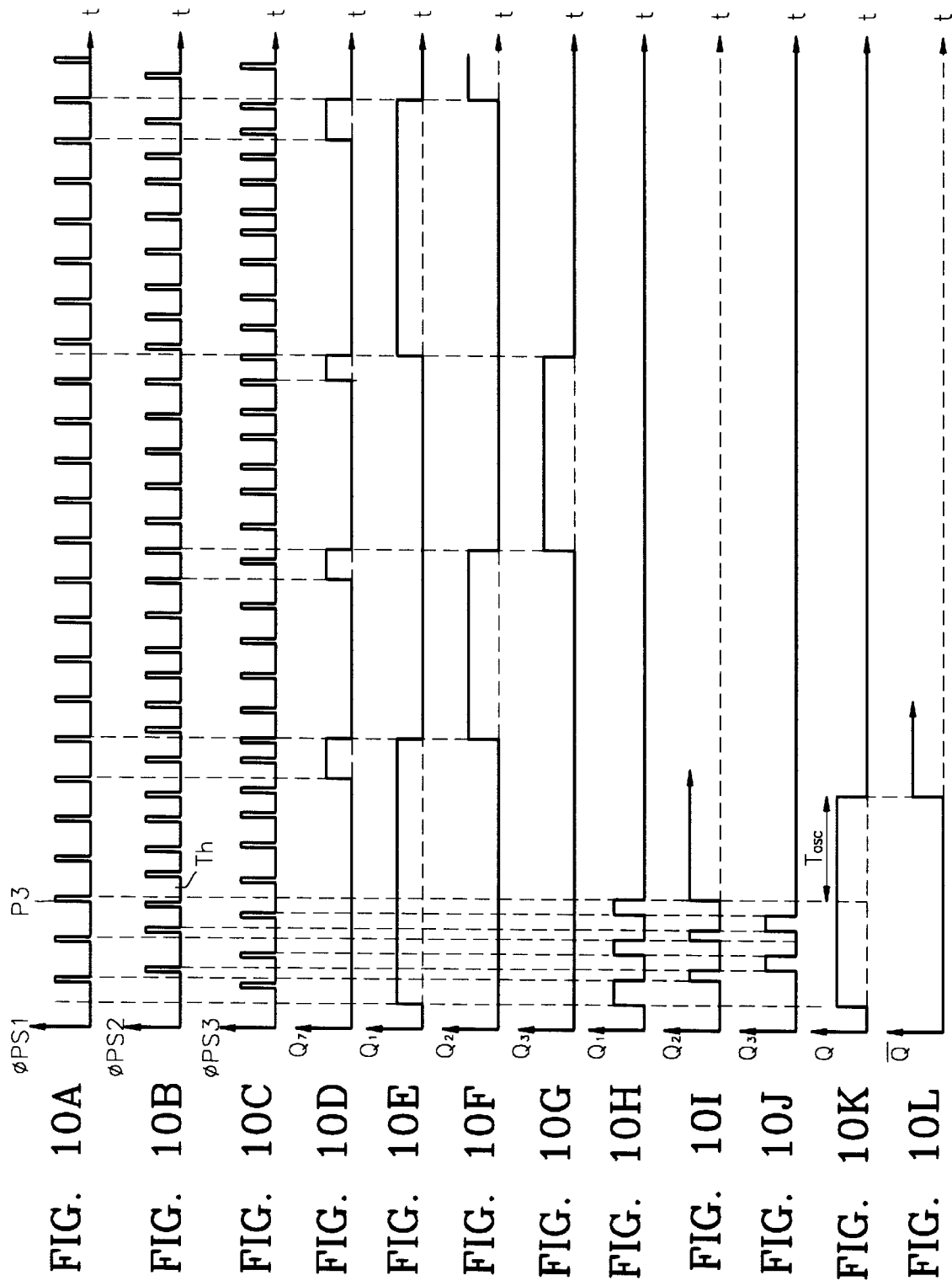

SEMICONDUCTOR DEVICE MANUFACTURING APPARATUS HAVING CONTROLLER DETECTING FUNCTION OF FILTER

This application relies for priority upon Korean Patent Application No. 99-4427, filed on Feb. 9, 1999, the contents of which are herein incorporated by reference in their entirety.

BACKGROUND OF THE INVENTION

1. Field of the Invention

The present invention relates to an apparatus used to manufacture a semiconductor device, and more particularly, to a semiconductor manufacturing apparatus having a controller detecting function of a filter.

2. Description of the Related Art

Most processes for manufacturing a semiconductor device require the use of chemical solutions. In particular, a chemical and mechanical polishing (CMP) apparatus used to planarize a highly integrated semiconductor device uses a slurry as a polishing agent. Such a slurry generally contains impurities, e.g., clustered impurities, in a predetermined size. These impurities contained in the slurry are then filtered by a filter, and the filtered slurry is used for a real process. However, once a filter has been used for a long period of time, the filtering function of the filter deteriorates. Accordingly, it takes an increased period of time to filter a predetermined amount of slurry.

FIG. 1 is a schematic view of a conventional CMP apparatus. Here, reference a represents a service area where the CMP apparatus is repaired, and reference b represents a clean room area where a real process is performed. Thus, the service area a and the clean room area b are separated and the concentration of particles in the atmosphere is also different in each area.

Referring to FIG. 1, within the service area a there is a tank 10 that contains a chemical solution 15 such as slurry, a pump 20 for circulating the chemical solution in the tank 10, and a filter for filtering impurities in the chemical solution discharged from the pump 20. Usually, the pump 20 is a diaphragm pump having an air inlet 23 and an air outlet 26. Also, a main body 30, i.e., a chemical mechanical polisher, is installed in the clean room area b. An outlet of the filter 35 is connected to the main body 30 to provide a part of the filtered chemical solution, i.e., a part of filtered slurry, to the main body 30. As the period of time that the filter 35 has been used increases, the filtering function of the filter 35 deteriorates. Also, as the functioning of the filter 35 decreases, the operating cycle of the pump 20 becomes longer. Also, in the worst case, the filter 35 may become clogged, so that the process in the main body 30, i.e., the CMP process, cannot be performed.

In the above-described conventional CMP apparatus, an operator must periodically check the operating cycle of the filter 35 installed in the service area and must take the time to replace the filter when necessary. However, visual and aural checking of the operating cycle of the pump 20 can be inaccurate. Thus, a set maximum safe period of use for a filter 35 is predetermined, and when the actual period of time for which the filter 35 has been used reaches this set maximum safe usable period, the filter 35 should be replaced. However, all filters have different life spans, and so it is difficult to differentiate the maximum actual usable period for each filter. Thus, it is difficult to efficiently use the filter and to prevent problems caused by the clogging of the filter or the discarding of usable filters.

SUMMARY OF THE INVENTION

It is an object of the present invention to provide a semiconductor device manufacturing apparatus capable of accurately detecting whether a filter has deteriorated by changing the operating cycle of a pump that circulates a chemical solution into an electrical pulse signal and then by measuring the cycle of the pulse signal.

It is another object of the present invention to provide a semiconductor device manufacturing apparatus capable of accurately detecting the timing for replacing a filter according to the condition of the filter, thereby preventing abrupt stoppages of a main body during processing.

It is still another object of the present invention to provide a semiconductor device manufacturing apparatus having a controller that automatically detects the level of a chemical solution in a tank, thereby preventing accidents caused by the shortage of a chemical solution in a tank.

According to an aspect of the present invention to achieve these and other objects, there is provided a semiconductor device manufacturing apparatus comprising: a tank for storing a chemical solution; a pump for circulating the chemical solution contained in the tank; a filter interposed between the pump and the inlet of the tank, for filtering impurities from the circulating chemical solution; at least one main body connected to an outlet of the filter, for a predetermined function; a pumping cycle sensor for changing the pumping operation of the pump into an electrical signal, e.g. a pulse signal; and a controller for measuring the cycle time of the pulse signals generated by the pumping cycle sensor to determine the level of deterioration of the filter.

The pump circulates the chemical solution contained in the tank. Preferably, at least one level sensor is installed on the sidewalls of the tank. A signal generated by at least one level sensor is transferred to the controller. The controller then processes the signal transferred from the at least one level sensor to detect the amount of chemical solution contained in the tank. Preferably, the pump is a diaphragm pump having an air inlet and an air outlet. The diaphragm pump releases air with a constant pressure via the air outlet whenever the chemical solution contained in the tank is transferred to the filter. When the chemical solution is a slurry used for chemical mechanical polishing, at least one main body corresponds to a chemical mechanical polisher.

The pumping cycle sensor preferably comprises a switch for supplying a power supply voltage, e.g., a DC power voltage, to the controller whenever a button supported by a spring installed in the body is pressed, and a panel installed between the button and the air outlet of the pump. One end of the panel is connected to the body of the switch by a hinge. Thus, when a predetermined pressure of air is exhausted via the air outlet of the pump, the switch instantaneously turns on to transfer a pulse signal to the controller.

The controller preferably comprises an adaptor for changing an AC power voltage to a DC power voltage, a pumping cycle setting portion for storing the maximum allowable operating period of the pump, a pumping cycle signal generator for generating a toggle signal whose logic state changes whenever a pulse signal is input from the pumping cycle sensor, a pumping cycle measuring portion for measuring the time for which the toggle signal output from the pumping cycle signal generator remains at a first state, a comparator for determining whether the maximum allowable operating period stored in the pumping cycle setting portion is equal to the actual operating cycle of the pump measured by the pumping cycle measuring portion, a first switch interposed between the pumping cycle sensor and the pumping cycle signal generator, a second switch interposed between the pumping cycle signal generator and the pumping cycle measuring portion, an alarm unit for generating an alarm and turning off the first and second switches when the measured pumping cycle is equal to the maximum allowable operating period, to stop the operation of the pumping cycle signal generator and the pumping cycle measuring portion, and a reset switch for initializing the pumping cycle signal generator and the pumping cycle measuring portion.

Preferably, the controller further comprises a multi-vibrator for operating the alarm unit when the pulse signal output via the first switch is longer than a predetermined cycle. More preferably the multi-vibrator is a triggerable multi-vibrator.

According to another aspect of the present invention to achieve these and other objects, there is provided a semiconductor device manufacturing apparatus comprising a plurality of chemical solution supply units, a plurality of main bodies and a controller.

The plurality of chemical solution supply units and the plurality of main bodies are connected in a one-to-one relationship. Each chemical solution supply unit comprising a tank having an inlet and an outlet, a pump interposed between the inlet and outlet of the tank for circulating the chemical solution contained in the tank, a filter interposed between an outlet of the pump and the inlet of the tank, and a pumping cycle sensor for changing the pumping cycle of the pump into an electrical signal, e.g., a pulse signal. The outlet of the filter is connected to one of the plurality of main bodies. Preferably, each pump is a diaphragm pump. When the chemical solution is a slurry, the main body corresponds to a chemical mechanical polisher. Each pumping cycle sensor has the same structure and function as the pumping cycle sensor described above.

One controller receives a sequence of pulse signals generated by each pumping cycle sensor, and measures the operating cycles of each pump, sequentially. When at least one pump of the plurality of pumps has a cycle longer than a predetermined cycle or does not operate, the controller generates a signal, e.g., an alarm, capable of being perceived by an operator. Also, the controller selectively outputs a signal that controls the operation of the main body connected to the pump having the operating cycle longer than the predetermined cycle.

Preferably, the semiconductor device manufacturing apparatus comprises at least one level sensor at the sidewall of the tank. The level sensor detects the amount of chemical solution contained in the tank as in the above embodiment.

The controller preferably comprises an adaptor, a pumping cycle setting portion, a first switching portion, a pumping cycle signal generator, a pumping cycle measuring portion, a comparator, a second switching portion, a reset switch and an alarm unit. Here, the adaptor, the pumping cycle setting portion, the pumping cycle signal generator, the pumping cycle measuring portion, the comparator and the second switching portion have the same structures and functions as those in the first embodiment.

Also, the first switching portion is preferably an element corresponding to the first switch of the semiconductor device manufacturing apparatus according to the first embodiment of the present invention, and the alarm unit is a modification of the alarm unit according to the first embodiment. Also, the reset switch initializes the pumping cycle signal generator, the pumping cycle measuring portion and the switching portion.

The first switching portion transfers a sequence of pulse signals generated by the plurality of pumping cycle sensors to the pumping cycle signal generator, and the alarm unit outputs a control signal that turns off or on the first switching portion and the second switching portion according to the output signal of the comparator. Also, when the pumping cycle measured by the pumping cycle measuring portion is equal to the pumping cycle stored in the pumping cycle setting portion, the alarm unit outputs a control signal that turns off the first and second switching portions, and simultaneously generates a signal, e.g., an alarm, capable of being perceived by an operator.

Preferably, the semiconductor device manufacturing apparatus further comprises a pump state sensor connected in parallel to the pumping cycle sensor and the first switching portion. When at least one pump of the plurality of pumps has a cycle longer than a predetermined cycle or does not operate, the pump state sensor outputs a signal that operates the alarm unit.

As described above, when the operating cycle of the pump is equal to a predetermined time, the semiconductor device manufacturing apparatus according to the present invention determines that the performance of the filter is deteriorated, thereby generating an alarm. As a result, it is possible to save the operator the trouble of continuously entering the service area where the pump is installed, and the timing for replacing the filter can be accurately detected. Thus, use of filters can be efficiently managed, and so excessive consumption of the filter, as well as abrupt stoppages in the operation of each main body can be prevented.

BRIEF DESCRIPTION OF THE DRAWINGS

The above objects and advantages of the present invention will become more apparent by describing in detail preferred embodiments thereof with reference to the attached drawings in which:

FIGS. 10A through 10C are waveforms of the signals output from each pumping cycle sensor of FIG. 8;

FIG. 10D is a waveform of the signal output from a first decoder of the switching portion in FIG. 9;

FIGS. 10E through 10G are waveforms of the signals output from a second decoder of the switching portion in FIG. 9;

FIGS. 10H through 10J are waveforms of the signals output from a decoder of the pump state sensor in FIG. 9; and FIGS. 10K through 10L are waveforms of the signals output from a multi-vibrator of the pump state sensor in FIG. 9.

DESCRIPTION OF THE PREFERRED EMBODIMENTS

Hereinafter, preferred embodiments of the present invention will be described in detail for a chemical mechanical polishing apparatus. However, the present invention is not limited to the disclosed chemical mechanical polishing apparatus and is applied to all semiconductor device manufacturing apparatuses using a chemical solution and a filter.

Figure 1:
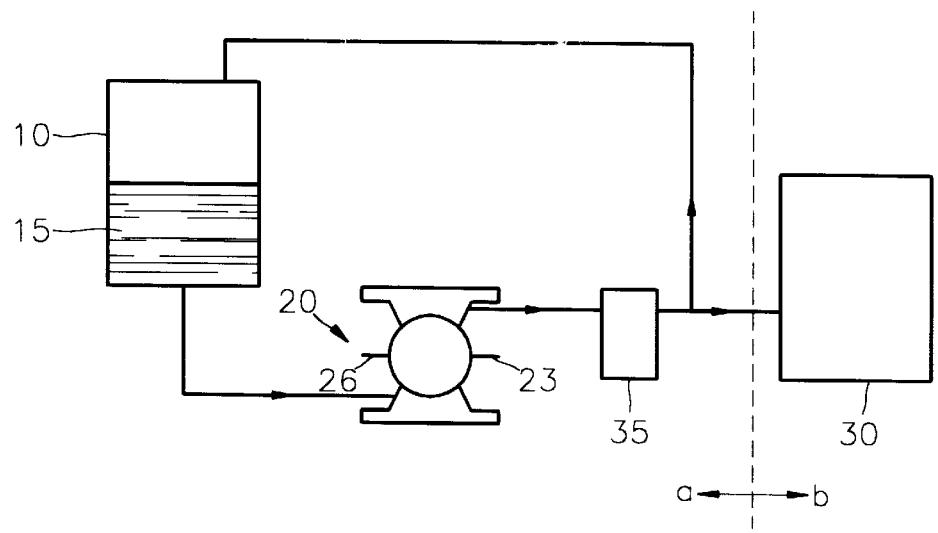
FIG. 1 is a schematic view of a conventional semiconductor device manufacturing apparatus.
Figure 2:
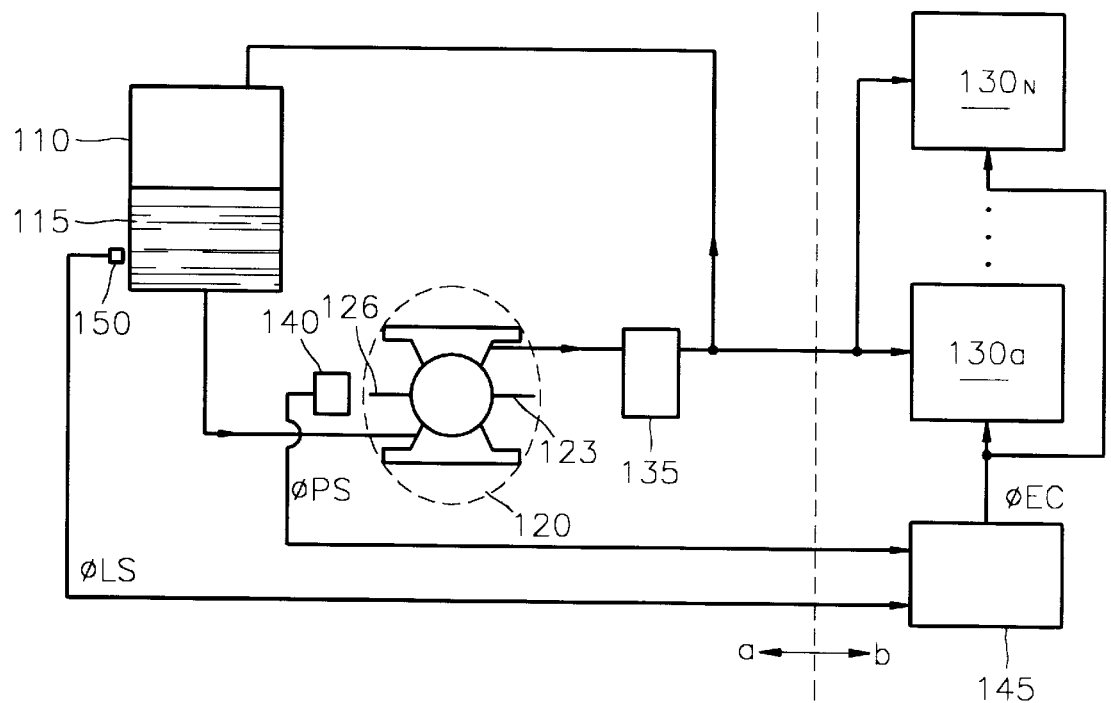
FIG. 2 is a schematic view of a semiconductor device manufacturing apparatus according to a first preferred embodiment of the present invention.

In FIG. 2, reference a represents a service area, and reference b represents a clean room area, wherein the service area a and the clean room area b are separated from each other.

Referring to FIG. 2, within the service area a there is a tank 110 that contains a chemical solution 115 such as slurry, a pump 120 that circulates the chemical solution 115, a filter 135 interposed between an outlet of the pump 120 and the tank 110 to remove impurities from the circulating chemical solution 115, and a pumping cycle sensor (PCS) 140 adjacent to the pump 120. Also, within the clean room area b there is at least one main body connected to an outlet of the filter 135, i.e., N chemical mechanical polishers $130_a$, $130_b$, ... $130_N$. and a controller 145 for generating a signal $\Phi EC$ that controls the operation of at least one main body $130_a$, $130_b$, ..., or $130_N$ according to an electrical signal generated by the PCS 140.

Preferably, the pump 120 is a diaphragm pump having an air inlet 123 and an air outlet 126. The diaphragm pump quickly discharges a constant pressure of air via the air outlet 126 in every pumping operation. Thus, the pumping cycle of the pump 120 can be sensed by installing the PCS 140 in front of the air outlet 126. The PCS 140 generates a pulse signal $\Phi PS$ at the moment when the air is discharged from the air outlet 126 of the pump 120. Thus, the cycle of the pulse signal $\Phi PS$ corresponds to the pumping cycle of the pump 120.

Meanwhile, as a part of the chemical solution 115 contained in the tank 110 is consumed during operation of at least one main body $130_a$, $130_b$, ..., or $130_N$, the level of the chemical solution 115 contained in the tank 110 is lowered. Thus, it is preferable to install at least one level sensor on a side wall of the tank 110. For example, a low level sensor 150 may be installed on a lower sidewall of the tank 110. When the level of the chemical solution 115 contained in the tank 110 drop below the level of the low level sensor, the low level sensor 150 generates an output signal $\Phi LS$ corresponding to a first state, i.e., indicating that the amount of chemical solution 115 has dropped below a minimum level. In this case, the controller 145 generates a signal, e.g., an alarm, which can be perceived by an operator.

In this example, the first state may correspond to logic "1" and a second state may correspond to logic "0." However, alternative states may be used.

The PCS 140 of FIG. 2 will now be described in detail with reference to FIG. 3 which is a schematic view of the pump 120 and the PCS 140.

Figure 3:
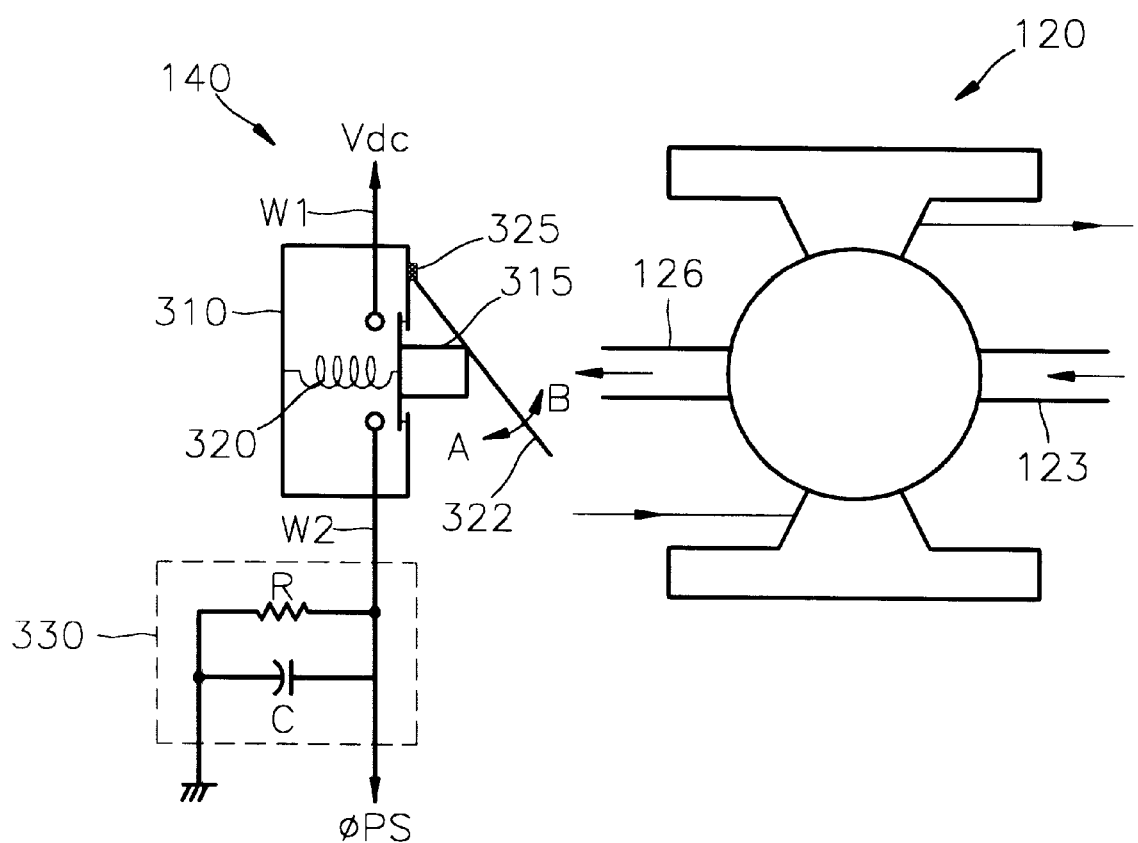
FIG. 3 is a schematic view showing the pumping cycle sensor and the pump of FIG. 2.

Referring to FIG. 3, the PCS 140 is installed in front of the air outlet 126 of the pump 120. The pump 120, e.g., a diaphragm pump, discharges air at a constant pressure via the air outlet 126 so as to circulate the chemical solution 115. Thus, as the amount of circulation of the chemical solution 115 through the filter 135 increases, the filtering function of the filter 135 deteriorates. As a result, the operating cycle of the pump 120 lengthens.

The PCS 140 includes first and second wires $W_1$, and $W_2$ installed in a box 310 separated by a predetermined interval, a button 315 for electrically connecting or disconnecting the two wires $W_1$ and $W_2$, a spring 320 fixed to the box 310 to support the button 315, and a panel 322 installed between the button 315 and the air outlet 126 of the pump 120. One end of the panel 322 is connected to the box 310 by a hinge 325. Thus, when air at a predetermined pressure is discharged via the air outlet 126 of the pump 120, as shown in FIG. 3, the panel 322 moves in a direction A, pushing the button 315, and electrically connecting the two wires $W_1$ and $W_2$. When the pump 120 stops operating, air at the predetermined pressure is no longer discharged from the air outlet 126, so the button 315 returns to the initial state by the elastic force of the spring 320. As a result, the panel 322 moves in a direction B, and electrically disconnects the two wires $W_1$ and $W_2$.

The first wire $W_1$ is connected to a power source that generates a DC power voltage $V_{dc}$. Thus, whenever the pump P operates, and the two wires $W_1$ and $W_2$ are connected, and a power supply voltage $V_{dc}$ is instantaneously applied to the second wire $W_2$ to allow the pumping cycle sensor PCS 140 to generate a pulse signal $\Phi PS$. The second wire $W_2$ is connected to ground via an RC circuit 330 including a resistor R and a capacitor C, which are connected in parallel. The RC circuit 330 controls the output of the PCS 140 to have a stable ground potential when the two wires are opened and eliminates noise that may be generated when the first and second wires $W_1$ and $W_2$ are electrically connected or disconnected. Thus, the PCS 140 generates a stable pulse signal $\Phi PS$ via the RC circuit 330.

Figure 4:
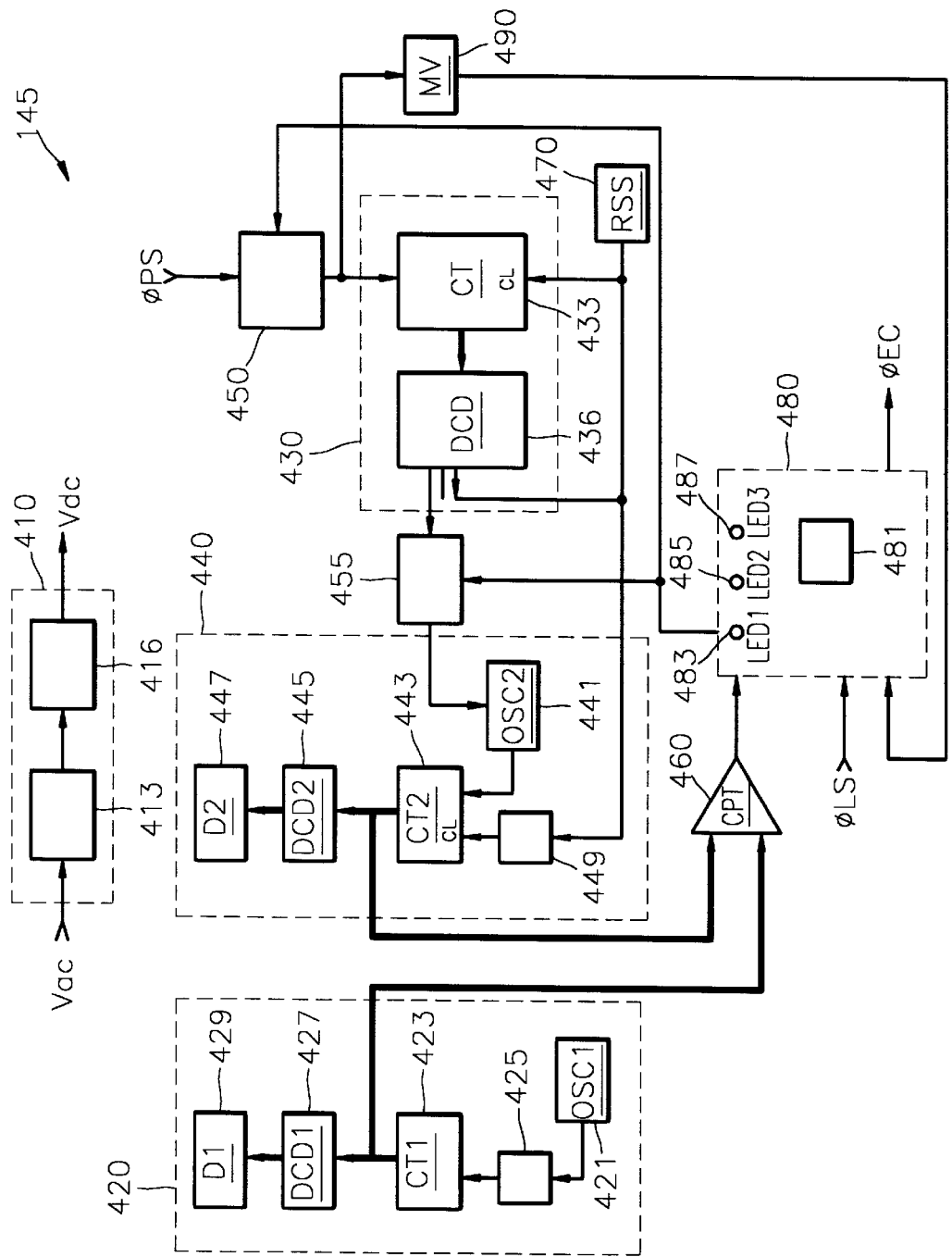
FIG. 4 is a block diagram of the controller of FIG. 2.

FIG. 4 is a detailed block diagram of the controller 145 of FIG. 2.

Referring to FIG. 4, the controller 145 includes an adaptor (ADT) 410 for converting an AC power voltage $V_{ac}$ to a DC power voltage $V_{dc}$, a pumping cycle setting portion (PCSP) 420 for storing the maximum allowable operating period of the pump 120, a pumping cycle signal generator (PCSG) 430 for generating a toggle signal the logic state of which changes whenever the PCS 140 generates a pulse signal, a pumping cycle measuring portion (PCMP) 440 for measuring the actual pumping cycle of the pump 120 using the toggle signal, a first switch (SW1) 450 interposed between the PCSG 430 and the PCS 140 of FIG. 3, a second switch (SW2) 455 interposed between the PCSG 430 and the PCMP 440, a comparator (CPT) 460 for determining whether or not the maximum allowable operating period stored in the PCSP 420 is equal to the measured pumping cycle of the pump 120 which is measured by the PCMP 440, a reset switch (RSS) 470 for initializing the PCSG 430 and the PCMP 440, and an alarm unit (ALM) 480 for notifying the user of when it is time to replace the filter 135 of FIG. 2 using the signal received from the comparator 460, and outputting a signal $\Phi EC$ that controls the operation of at least one main body $130_a$, $130_b$, ..., or $130_N$ shown in FIG. 2 and a signal for controlling the first and second switches 450 and 455.

Also, it is preferable to interpose a multi-vibrator (MV) 490 between the output port of the first switch 450 and the alarm unit. The multi-vibrator 490, e.g., a triggerable multi-vibrator, generates a signal corresponding to a first state and the opposite signal for a predetermined period via two output ports as soon as one pulse signal is received. Thus, if the next pulse signal is not generated in a predetermined period after one pulse signal is generated by the PCS 140, the multi-vibrator MV 490 can generate a control signal for operating the alarm unit. In other words, if the pump 120 suddenly stops operating while the pumping cycle measured by the PCMP 440 is shorter than that stored in the PCSP 420, the alarm unit does not generate an alarm. Thus, without a multi-vibrator 490, an operator cannot recognize whether the pump 120 is in a normal or abnormal state. However, when a multi-vibrator 490 is installed, the alarm unit operates even if the pump 120 suddenly stops, such that the operator can recognize the state of the pump 120.

Also, the adaptor 410 comprises a transformer (TF) 413 for converting a first AC voltage $V_{ac}$ into a second AC voltage having a desired value, and a rectifier (RCT) 416 for converting the second AC voltage into a DC power voltage $V_{dc}$. The DC power voltage $V_{dc}$ generated by the adaptor 410 is used as power supply voltage for each element of the controller 145 to be illustrated later.

The PCSP 420 includes a first oscillator 421 for repeatedly generating pulse signals of a predetermined period, a first counter 423 for counting the number of pulse signals generated by the first oscillator 421, a counter switch 425 interposed between the first counter 423 and the first oscillator 421, for transferring only as many pulse signals as desired, a first decoder 427 for converting the output signal of the first counter 423 into a code suitable for display as a decimal number, and a first indicator 429 for displaying the output signal of the first decoder 427 as a decimal number. Preferably, the first counter 423 is an up/down counter and the first indicator 429 comprises at least one seven-segment display. For example, if the maximum allowable operating period of the pump 120 is 10~99 sec, the first indicator 429 may comprise two seven-segment displays. Also, if the maximum allowable operating period of the pump 120 is shorter than 9 sec, the first indicator 429 may comprise a single seven-segment display.

The PCSG 430 comprises a counter 433 for incrementing by one the output signal expressed as a binary code, whenever the pulse signal ΦPS generated by the PCS 140 is received via the first switch 450, and a decoder 436 for outputting via an output pin a toggle signal, whose logic state changes whenever the output signal of the counter 433 increases. The first switch 450 is controlled by the alarm unit 480. Also, the PCSG 430 may comprise one chip having a logic circuit that outputs a toggle signal every time the pulse signal ΦPS generated by the PCS 140 is input.

The PCMP 440 comprises a second oscillator 441 for repeatedly generating pulse signals having a predetermined cycle only when the toggle signal generated by the PCSG 430 is at a first or second logic state, a second counter 443 for counting the number of pulse signals generated by the second oscillator 441, a second decoder 445 for changing the signal output from the second counter 443 into a code suitable for displaying as a decimal number, and a second indicator 447 for displaying the output of the second decoder 445 as a decimal number.

The reset switch 470 initializes the counter 433 of the PCSG 430 and the second counter 443 of the PCMP 440. Preferably, a time delay circuit 449 is interposed between the reset switch 470 and the second counter 443, which operates to initialize the PCSG 430 and the PCMP 440 in sequence such that the controller 145 is initialized in a stable manner. Also, preferably the predetermined cycle of the pulse signals generated by the second oscillator 441 is adjusted to have a time scale fine enough to measure accurately, compared to the maximum allowable pumping cycle displayable on the first indicator 429. For example, in a case where the maximum allowable pumping cycle stored in the PCSP 420 is 1~9 sec, the period of the pulse signals generated by the second oscillator 441 is expressed in units of 0.1 sec.

The comparator 460 determines whether or not the output signal of the first counter 423 is equal to the output signal of the second counter 443. For example, when the pumping cycle measured by the second counter 443 is equal to the pumping cycle stored in the first counter 423, the comparator 460 outputs a signal of a first state. On the other hand, when the output signals from the first and second counters 423 and 443 are different, the comparator 460 outputs a signal of a second state.

When the pumping cycle measured by the second counter 443 is equal to the pumping cycle set by the first counter 423, the alarm unit 480 generates a signal which an operator can perceive, e.g., an alarm, and outputs a control signal that turns off the first and second switches 450 and 455. In other words, when the output signal of the comparator 460 is at a first state, the alarm unit 480 generates an alarm and outputs a control signal that turns off the first and second switches 450 and 455, thereby interrupting the operation of the PCSG 430 and the PCMP 440. Also, the operator initializes the second counter 443 and the PCSG 430 by turning on the reset switch 470, thereby ceasing the alarm and taking suitable steps.

For example, suppose an end cycle switch ECS 481 is turned on to output an end cycle signal ΦEC that controls the operation of the main bodies $130_a$, $130_b$, ..., and $130_N$, and the filter 135 is replaced with a new one. When the end cycle signal ΦEC is input to the main bodies $130_a$, $130_b$, ..., and $130_N$, the wafer under operation is successfully processed and then the operations of the main bodies $130_a$, $130_b$, ..., and $130_N$ stop. Thus, damage or abnormal processing of a wafer in the main body can be prevented. Also, when the output of the comparator 460 is at the first state, the alarm unit 480 may generate another signal which can be perceived by the operator, as well as the alarm. For example, the alarm unit 480 can generate a light via a first light emitting diode 483.

Also, the alarm unit 480 can sense the amount of the chemical solution 115 contained in the tank 110 using an electrical signal ΦLS generated by at least one level sensor illustrated with reference to FIG. 2, e.g. a low level sensor 150. In detail, the alarm unit 480 generates an alarm whenever the level of the chemical solution 115 contained in the tank 110 is lower than the height of the low level sensor 150, and turns on a second light emitting diode 485.

Also, the alarm unit 480 generates an alarm using a signal generated by the multi-vibrator MV 490 when the pump 120 abruptly stops, and turns on a third light emitting diode 487. Thus, when the second light emitting diode 485 is turned on, the additional chemical solution 115 is supplied to the tank 110, such that an accident caused by the shortage of the chemical solution 115 can be prevented. Also, when the third light emitting diode 487 is turned on, the chemical mechanical polishing of the wafer is completed and the pump 120 is immediately repaired, thereby preventing malfunction of the pump 120. As a result, it is possible to eliminate the inconvenience of the operator having to enter at all times the service area a where the tank 110 and the pump 120 are installed.

Figure 5:
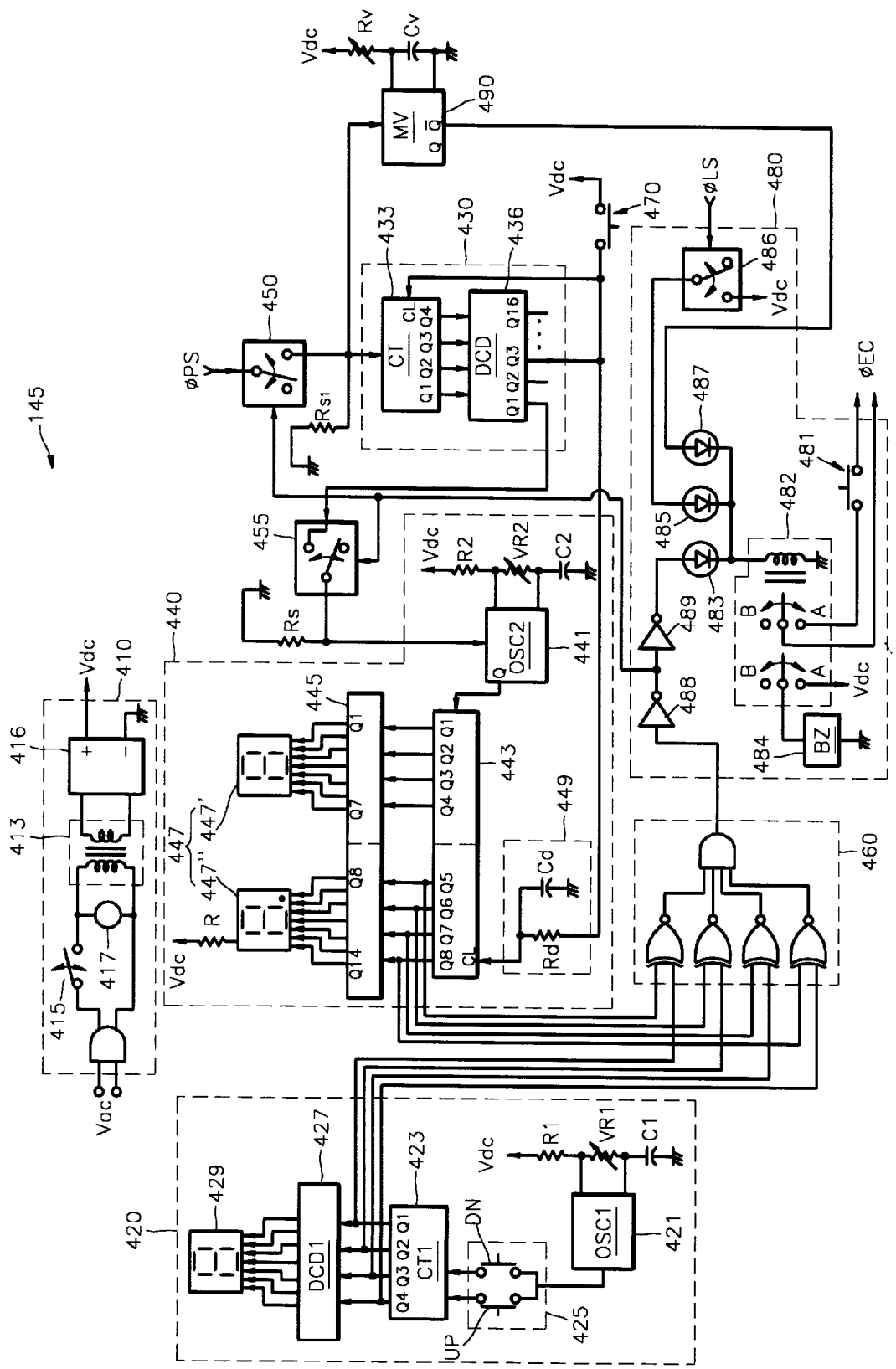
FIG. 5 is a detailed circuit diagram of the controller shown in FIG. 4.

FIG. 5 is a circuit diagram of the controller 145 of FIG. 4, in which the maximum allowable operating period is set to 1~9 sec. The circuit diagram of FIG. 5 is for illustrating the controller 145 of a semiconductor device manufacturing apparatus according to a first preferred embodiment of the present invention. However, the present invention is not limited to the controller 145 of FIG. 5. For example, the circuit diagram of FIG. 5 can be modified in numerous areas, e.g., such that the maximum allowable operating period of the pump can be set to 10~99 sec and an actual operating cycle length up to 10~99 sec can be measured. Also, the controller 145 could be constructed using other elements that are not shown in FIG. 5. Here, reference characters the same as those in FIG. 4 represent the same elements.

The controller 145 according to a first preferred embodiment of the present invention will be described with reference to FIGS. 5 and 6A through 6I.

Referring to FIG. 5, the adaptor 410 includes a transformer 413 for changing a first AC voltage $V_{ac}$ into a second AC voltage with a desired level, and a rectifier 416 for changing the second AC voltage into a DC power voltage $V_{dc}$. The DC power voltage $V_{dc}$ generated by the adaptor 410 is used as a power supply voltage for each element of the controller 145, which will be explained in detail later. Preferably, the adaptor 410 also includes a power switch 415 connected in series to the transformer 413, and a power lamp 417 connected in parallel to the transformer 413.

The PCSP 420 comprises a first oscillator 421 for repeatedly generating pulse signals, and a first counter 423 connected to an output pin of the first oscillator 421, for counting the number of pulse signals generated by the first oscillator 421. The first counter 423 comprises an up/down counter having four output pins Q1, Q2, Q3 and Q4. A counter switch 425 is interposed between the first oscillator 421 and the first counter 423, by which a desired number of pulse signals are transferred from the first oscillator 421 to the first counter 423.

The period of the pulse signals generated by the first oscillator 421 can be adjusted to be an arbitrary value. For example, a first resistor $R_1$, a first variable resistor $VR_1$ and a first capacitor $C_1$ can be connected to the first oscillator 421 and pulse signals can be generated to have a desired period by controlling the resistance of the first variable resistor $VR_1$.

Preferably, the counter switch 425 comprises an up button UP for counting in ascending order and a down button DN for counting in descending order when the first counter 423 is an up/down counter.

The binary code output via four output pins Q1, Q2, Q3, and Q4 of the first counter 423 is converted into a binary code that is suitable to display as a decimal number via a first decoder 427, which has seven output pins. In addition, the output signal from the first decoder 427 is displayed as a decimal number via a first indicator 429, e.g., a seven-segment display.

As described above, the operator can store a desired pumping cycle time, i.e., a maximum allowable operating period of the pump, in the PCSP 420 using the counter switch 425.

The PCSG 430 comprises a counter 433 having four output pins Q1, Q2, Q3, and Q4, and a decoder 436 in which sixteen output pins Q1, . . . , and Q16 output a signal of the first logic state in sequence whenever the output signals of the counter 433 change. Also, an input pin of the counter 433 is connected via the first switch 450 to the PCS 140. The input pin of the counter 433 is connected via a switch resistor $R_{S1}$ to ground. The reason for connecting the input pin of the counter 433 to the ground via the switch resistor $R_{S1}$ is so that a stable ground potential can be applied to the input pin of the counter 433 when the first switch 450 is turned off. The first output pin of the decoder 436 is connected via a second switch 455 to an input pin of a second oscillator 441 of the PCMP 440.

Preferably, the second output pin Q2 and the fourth through sixteen output pins Q4 through Q16 of the decoder 436 are in a floating state and the third output pin Q3 is connected to a clear pin CL of the counter 433. Also, the third output pin Q3 of the decoder 436 is connected to a reset switch 470 and a clear pin CL of the second counter 443 included in the PCMP 440.

The operation of the PCSG 430 having the above structure will be described with reference to FIGS. 6A through 6H. Here, the horizontal axis represents time (t) and the vertical axis represents the logic values of each output pin.

When the counter 433 of the PCSG 430 is initialized while all the first and second switches 450 and 455 are turned on, all of the four output pins of the counter 433 output the second state. Accordingly, only the first output pin Q1 of the decoder 436 keeps the first state. Then, as soon as a first pulse signal is generated by the PCS 140, the fourth output pin Q4 of the counter 433 shows the first state until the PCS 140 generates a second pulse signal. In other words, the period for which the fourth output pin Q4 of the to counter 433 keeps the first logic state corresponds to a first cycle time T1. Here, only the second output pin Q2 of the sixteen output pins of the decoder 436 shows the first state.

Then, when the second pulse signal is generated by the PCS 140, only the third output pin Q3 of the four output pins of the counter 433 shows the first state. At the same time, the decoder 436 outputs a signal of logic at the first state only via the third output pin Q3, so that the counter 433 is initialized. As a result, all the output pins Q1, Q2, Q3, and Q4 of the counter 433 are transited to the second state and only the first output pin Q1 of the decoder 436 shows the first state.

Thus, when the second pulse signal is generated by the 140, the third output pin Q3 of the counter 433 and the third output pin Q3 of the decoder 436 simultaneously generate a pulse signal having a narrow width. Accordingly, whenever the third output pin Q3 of the decoder 436 instantaneously generates a pulse signal, the counter 433 and the second counter 443 are initialized. Also, the first output pin Q1 of the decoder 436 shows the first state for a second cycle time T2, that is, until the PCS 140 generates a third pulse signal.

Then, the third pulse signal and the following pulse signals are sequentially generated by the PCS 140, and the above operation of the PCSG 430 is repeated. Thus, the first output pin Q1 of the decoder 436 outputs a toggle signal that shows the first logic state for the even numbered cycles T2, T4, . . . , and the second logic state for the odd numbered cycles T1, T3, T5, . . . .

Meanwhile, the cycles of each pulse signal T1, T2, . . . generated by the PCS 140 become longer with increasing time because the performance of the filter 135 is deteriorated. Thus, the pulse width of the toggle signal generated by the PCSG 430 also increases over time.

Figure 6:
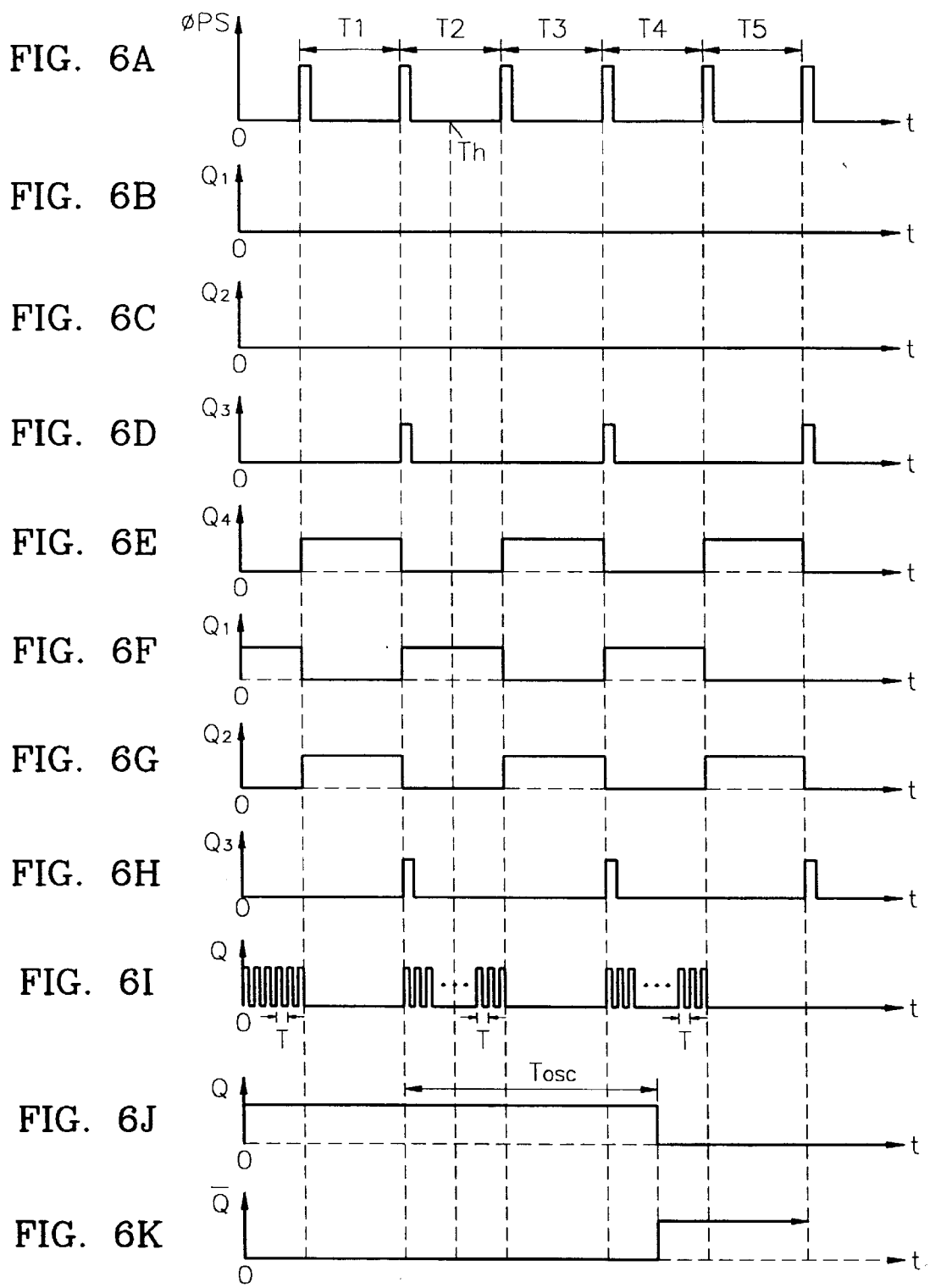
FIG. 6A is a waveform of an output signal from the pumping cycle sensor shown in FIGS. 3 and 5.
FIGS. 6B through 6E are waveforms of the signal output from a counter constituting the pumping cycle signal generator in FIG. 5.
FIGS. 6F through 6H are waveforms of the signal output from the decoder of the pumping cycle signal generator in FIG. 5.
FIG. 6I is a waveform of the signal output from a second oscillator of the pumping cycle measuring portion in FIG. 5.
FIGS. 6J and 6K are waveforms illustrating the function of the multi-vibrator shown in FIG. 5.

When the toggle signal output from the PCSG 430 is input via the second switch 455 to the second oscillator 441, e.g, an a stable oscillator, the second oscillator 441 continuously outputs pulse signals having a predetermined cycle time T (see FIG. 6I) for the period when the toggle signal keeps the first logic state. In this case, a second capacitor $C_2$, a second resistor $R_2$ and a second variable resistor $VR_2$ are preferably connected to the second oscillator 441, and the second variable resistor $VR_2$ is controlled to continuously generate a pulse signal having a cycle time T of 0.1 sec. Thus, as shown in FIG. 6I, the pulse signals having a cycle time of 0.1 sec are continuously generated from the output pin of the second oscillator 441 for the even numbered cycles T2, T4, . . . of FIG. 6A.

However, when the toggle signal shows the second logic state, the second oscillator 441 no longer generates a pulse signal. Thus, the second counter 443 connected to the output pin Q of the second oscillator 441 keeps the previous value for the odd numbered cycles T1, T3, . . . of FIG. 6A. The output pin of the second switch 455 is connected to ground via a switch resistor $R_{S2}$, in the same way as the output pin of the first switch 450.

The output pin Q of the second oscillator 441 is connected to an input pin of the second counter 443, which has eight output pins Q1, . . . , Q8; the eight output pins Q1, . . . , Q8 of the second counter 443 are connected to the input pins of the second decoder 445, which has fourteen output pins. The output pins of the second decoder 445 are connected to a second indicator 447, which includes first and second seven segment displays 447' and 447". Preferably, the first through seventh output pins Q1, . . . , Q7 of the fourteen output pins of the second decoder 445 are connected to the first seven-segment display 447', and the eighth through fourteenth output pins Q8, . . . , Q14 are connected to the second seven-segment display 447".

The number of pulse signals generated via the output pin Q of the second oscillator 441 is output in a binary code via the first through fourth output pins Q1, . . . , Q4 of the second counter 443. Then, the binary code output via the first through fourth output pins Q1, . . . , Q4 of the second counter 443 is converted into a binary code suitable to display as a decimal number by the second decoder 445. The binary code output via the second decoder 445, which is suitable for display as a decimal number, is displayed on the first seven-segment display 447' as a decimal number via the first through seventh output pins Q1, . . . , Q7 of the second decoder 445. When pulse signals corresponding to the order of an integer multiple of 10 are applied to the input pin of the second counter 443, the fifth through eighth output pins Q5, . . . , Q8 of the second counter 443 output a binary code to the second seven-segment display 447". This binary code is incremented by one from the previous state and the first through fourth output pins Q1, . . . , Q4 of the second counter 443 are simultaneously initialized.

Also, the binary code output via the fifth through eighth output pins Q5, . . . , Q8 of the second counter 443 is changed into a binary code suitable to display as a decimal number via the eighth through fourteenth output pins Q8, . . . , Q14 of the second decoder 445. The binary code output from the eighth through fourteenth output pins Q8, . . . , Q14 of the second decoder 445 is displayed as a decimal number via the second seven-segment display 447". Preferably the second seven-segment display 447" is capable of displaying a decimal point at the right, and an input pin for controlling the decimal point is connected via a control resistor $R_c$ to a power voltage $V_{dc}$.

As described above, the even numbered cycle times T2, T4, . . . of FIG. 6A are displayed as a decimal number via the second indicator 447, which comprises first and second seven-segment displays 447' and 447".

Furthermore, when the reset switch 470 is turned on, both the counter 433 and the second counter 443 are initialized.

Preferably, a time delay circuit 449 comprising a delay resistor $R_d$ and a delay capacitor $C_d$ is interposed between the reset switch 470 and the clear pin CL of the second counter 443 to stabilize the initialization of the second counter 443.

The comparator 460 compares the output signal of the first counter 423 to the output signal of the second counter 443. When the pumping cycle stored in the first counter 423 is in the range of 1~9 sec, the output signal of the second counter 443 must use only the signals that are output via the fifth through eighth output pins Q5, . . . , Q8. The comparator 460 may comprise four exclusive NOR gates and an AND gate. In detail, each exclusive NOR gate uses as an input signal one output pin of the first counter 423 and the corresponding output pin of the second counter 443. Also, the output pins of each exclusive NOR gate 462 are connected to the four input pins of the AND gate. Accordingly, when the output signal of the first counter 423 is equal to the output signal of the second counter 443, the output pin of the comparator 460 shows the first logic state. However, when the output signal of the first counter 423 is different from the output signal of the second counter 443, the output pin of the comparator 460 shows the second logic state.

The alarm unit (ALM) 480 comprises first and second inverters 488 and 489 connected in series to the output pin of the comparator 460, a relay switch 482 connected to the output pin of the second inverter 489, and a buzzer 484 connected to the relay switch 482. The relay switch 482 preferably includes two switches and one coil, and the two switches simultaneously turn on or off according to the current induced to the coil. In other words, when the output pin of the second inverter shows the first logic state, current flows through the coil and the two switches move in a direction toward A and turn on. As a result, the buzzer 484 operates and an end cycle signal ΦEC can be applied to the main bodies $130_a$, $130_b$, . . . and $130_n$ through an end cycle switch 481. However, when the output pin of the second inverter shows the second logic state, the two switches simultaneously move in a direction B, so the buzzer 484 does not operate.

Meanwhile, the output signal of the first inverter 488 controls the first and second is switches 450 and 455. Thus, when the pumping cycle of the pump 120 reaches the pumping cycle stored in the first counter 423, the first and second switches 450 and 455 are turned off, so that the PCSG 430 and PCMP 440 no longer operate and an alarm is generated by the buzzer 484. When the end cycle switch 481 is turned on and the end cycle signal ΦEC is transferred to the main bodies $130_A$, $130_b$, . . . , $130_N$, the current wafer process is successfully performed in the main bodies and then the process is stopped. Also, when the reset switch 470 is turned on to change the output signal of the comparator 460 to the second logic state, the operation of the buzzer 484 stops and the filter 135 can be replaced.

Also, a first light emitting diode 483, i.e., a pumping cycle sensing lamp, may be interposed between the second inverter 489 and the relay switch 482. In a case where the first light emitting diode 483 is additionally installed, the first light emitting diode 483a turns on as well as the buzzer 484 when the actual operating cycle of the pump 120 is equal to the maximum allowable operating cycle stored in the first counter 423. Thus, the operator can recognize the time to replace the filter 135 in a clean room.

Also, when a low level sensor 150 is installed on the lower sidewall of the tank 110, a low level sensing switch 486, which is turned on or off by a signal ΦLS generated by the low level sensor 150, is interposed between the relay switch 482 and a power voltage $V_{dc}$. Preferably, a second light emitting diode 485, i.e., a chemical solution sensing lamp, is interposed between the low level sensing switch 486 and the relay switch 482. Accordingly, when the level of the chemical solution 115, i.e., slurry, contained in the tank 110 is lower than the height of the low level sensor 150, the buzzer 484 operates and the second light emitting diode 485 also turns on. Thus, the operator can recognize when it is necessary to supplement the chemical solution 115 in the clean room.

Also, when the operation of the pump 120 stops abruptly, the alarm unit 480 does not generate an alarm when the actual operating cycle measured by the PCMP 440 is shorter than the pumping cycle stored in the PCSP 420. Thus, it is difficult for the operator to recognize in the clean room such a malfunction of the pump 120. Thus, a multi-vibrator (MV) 490 is preferably interposed between the output end of the first switch 450 and the relay switch 482 of the alarm unit 480. More preferably, the multi-vibrator 490 is a triggerable multi-vibrator. A triggerable multi-vibrator has first and second output ports Q and /Q. When a pulse signal is applied to the triggerable multi-vibrator, a signal of the first logic state is output for a predetermined time via the first output port Q. At the same time, the second output port /Q outputs a signal of the second logic state for the same predetermined time. Thus, when the PCS 140 generates a pulse signal and then does not generate the next pulse signal in the predetermined time, the triggerable multi-vibrator transfers a signal of the first logic state via the second output port /Q to the alarm unit 480. The predetermined time is set by controlling a variable resistor $R_v$ connected to the multi-vibrator 490, i.e., the triggerable multi-vibrator. In this portion of the circuit, the multi-vibrator is connected to both a capacitor $C_v$ and the variable resistor $R_v$. Also, the predetermined time must be set so that it is longer than the pumping cycle stored in the PCSP 420.

The operation and function of the multi-vibrator 490 will be described in detail with reference to FIGS. 6A, 6J and 6K.

When the PCS 140 generates a second pulse signal and the operation of the pump 120 stops at a predetermined point in time $T_j$, the multi-vibrator 490 outputs a signal of the first logic state via the first output port Q until a predetermined time $T_{osc}$ (set by the variable resistor $R_v$ and the capacitor $C_v$) passes after the input of the second pulse signal. The second other output port /Q outputs a signal having the opposite value as the signal output from the output port Q. In other words, the second output port /Q outputs a signal of the first logic state at a point in time when the signal output via the first output port Q changes from the first logic state to the second logic state. Thus, when the other output port /Q of the multi-vibrator 490 is connected to the relay switch 482 of the alarm unit 480, the buzzer 484 can generate an alarm when the pump 120 stops. This allows the operator to clearly recognize a malfunction of the pump 120. Also, when a third light emitting diode 487 is interposed between the multi-vibrator 490 and the relay switch 482, the operator can visually detect a malfunction of the pump 120.

Figure 7:
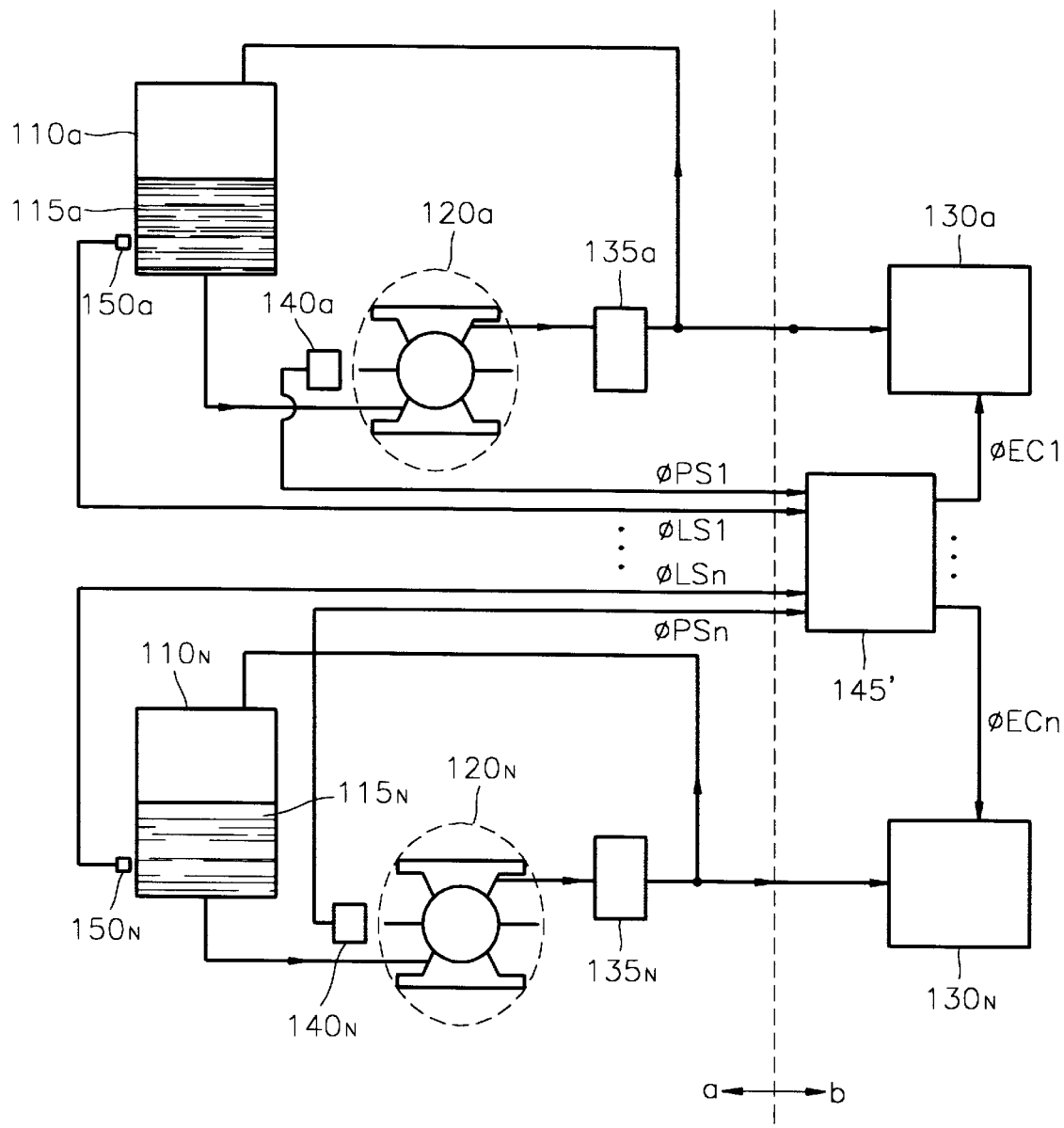
FIG. 7 is a schematic view of a semiconductor device manufacturing apparatus according to a second preferred embodiment of the present invention.

FIG. 7 is a schematic view of a semiconductor device manufacturing apparatus, i.e., a chemical machining polishing apparatus, according to a second preferred embodiment of the present invention. Unlike the first preferred embodiment illustrated with reference to FIG. 2, the operation of a plurality of pumps are detected by a single controller. Here, references a and b represent a service area and a clean room area, respectively, which are separate from each other.

Referring to FIG. 7, N chemical solution supply units, including a plurality of pumps, i.e., N pumps $120_a, \ldots, 120_n$, N tanks $110_a, \ldots, 110_n$, N pumping cycle sensors (PCSs) $140_a, \ldots, 140_N$, and N filters $135_a, \ldots, 135_N$ are all installed in the service area a. Each PCS $140_a, \ldots 140_N$ is preferably the same as that illustrated in the first preferred embodiment, and each pump $120_a, \ldots 120_N$ is preferably a diaphragm pump as illustrated in the first preferred embodiment.

Each chemical solution supply unit, is preferably the same, so the first chemical solution supply unit will be described by way of example. The first chemical solution supply unit comprises a first tank $110_a$ that contains a chemical solution $115_a$, a first pump $120_a$ interposed between the outlet and inlet of the first tank $110_a$, for circulating the chemical solution $115_a$, a first filter $135_a$ interposed between the outlet of the first pump $120_a$ and the inlet of the first tank $110_a$, and a first pumping cycle sensor $140_a$ installed in front of the air outlet of the first pump $120_a$.

A single controller 145' and a plurality of main bodies $130_a, \ldots, 130_N$, i.e., N chemical mechanical polishers, are installed in the clean room area b. The controller 145' detects the performance and state of each pump $120_a, \ldots 120_N$, using N pulse signals $\Phi PS_1, \ldots, \Phi PS_n$ output from the N pumping cycle sensors $140_a, \ldots 140_N$, which are installed in the service area a. Also, if required, the controller 145' outputs signals $\Phi EC_1, \ldots, \Phi EC_n$ that control the operation of each main body $130_a, \ldots 130_N$. Also, the controller 145' processes signals $\Phi LS_1, \ldots, \Phi LS_n$ transferred from N level sensors, i.e., N low level sensors $150_a, \ldots, 150_N$, each installed in the tanks, $110_a, \ldots 110_N$, thereby sensing the amount of chemical solution contained in each tank $110_a, \ldots 110_N$.

Since the operation of each unit is preferably substantially the same, the first unit will again be described by way of example. When the level of chemical solution contained in at the first tank, $110_a$ i.e., the level of the chemical solution $115_a$ contained in the first tank $110_a$, is lower than the height of the first low level sensor $150_a$, the controller 145' generates a signal such as an alarm, which allows the operator to recognize that it is time to supplement the chemical solution $115_a$ in the clean room.

Figure 8:
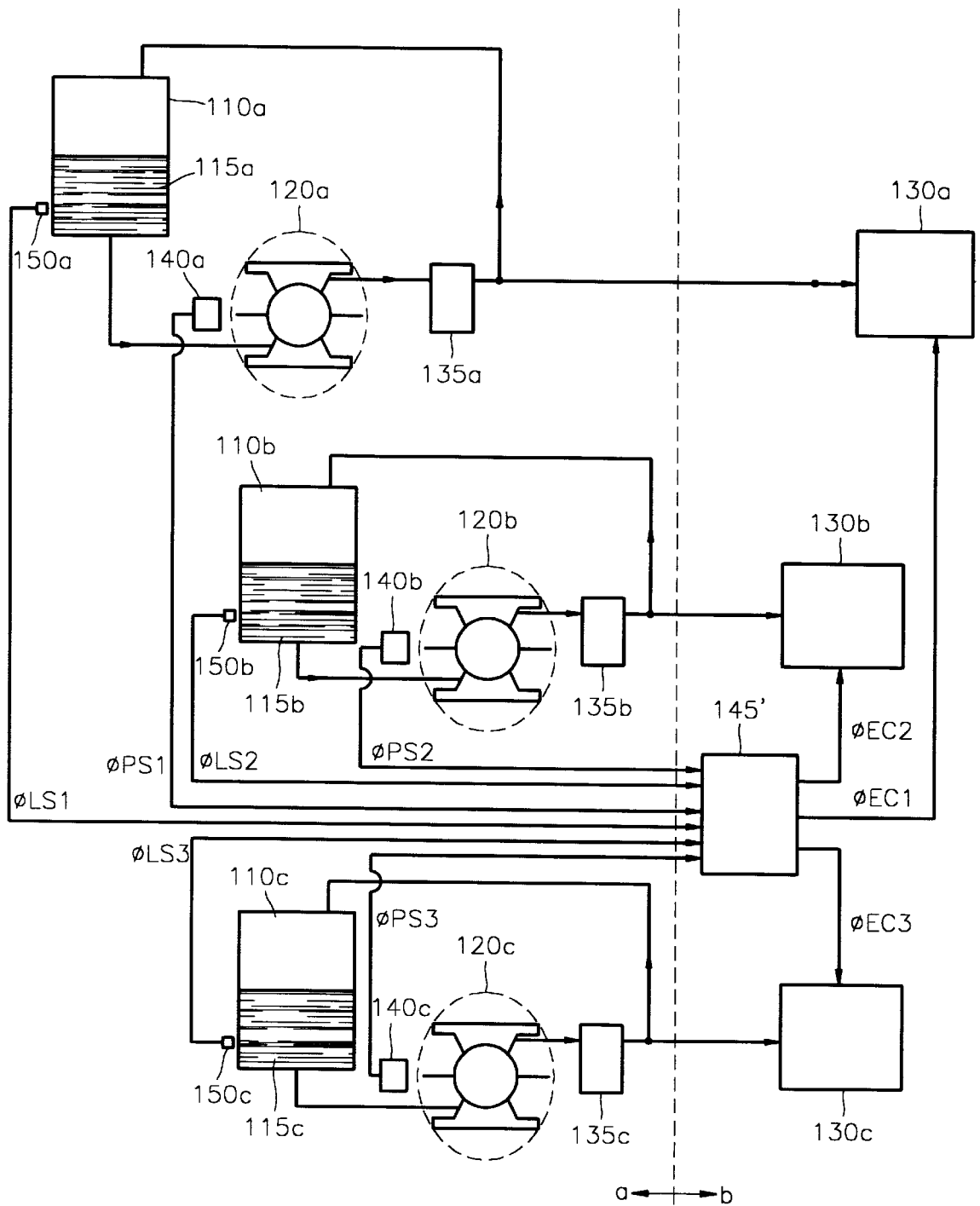
FIG. 8 is a specific example of the third preferred embodiment showing three chemical solution supply units.

FIG. 8 is a specific example of the second preferred embodiment showing three chemical solution supply units.

Figure 9:
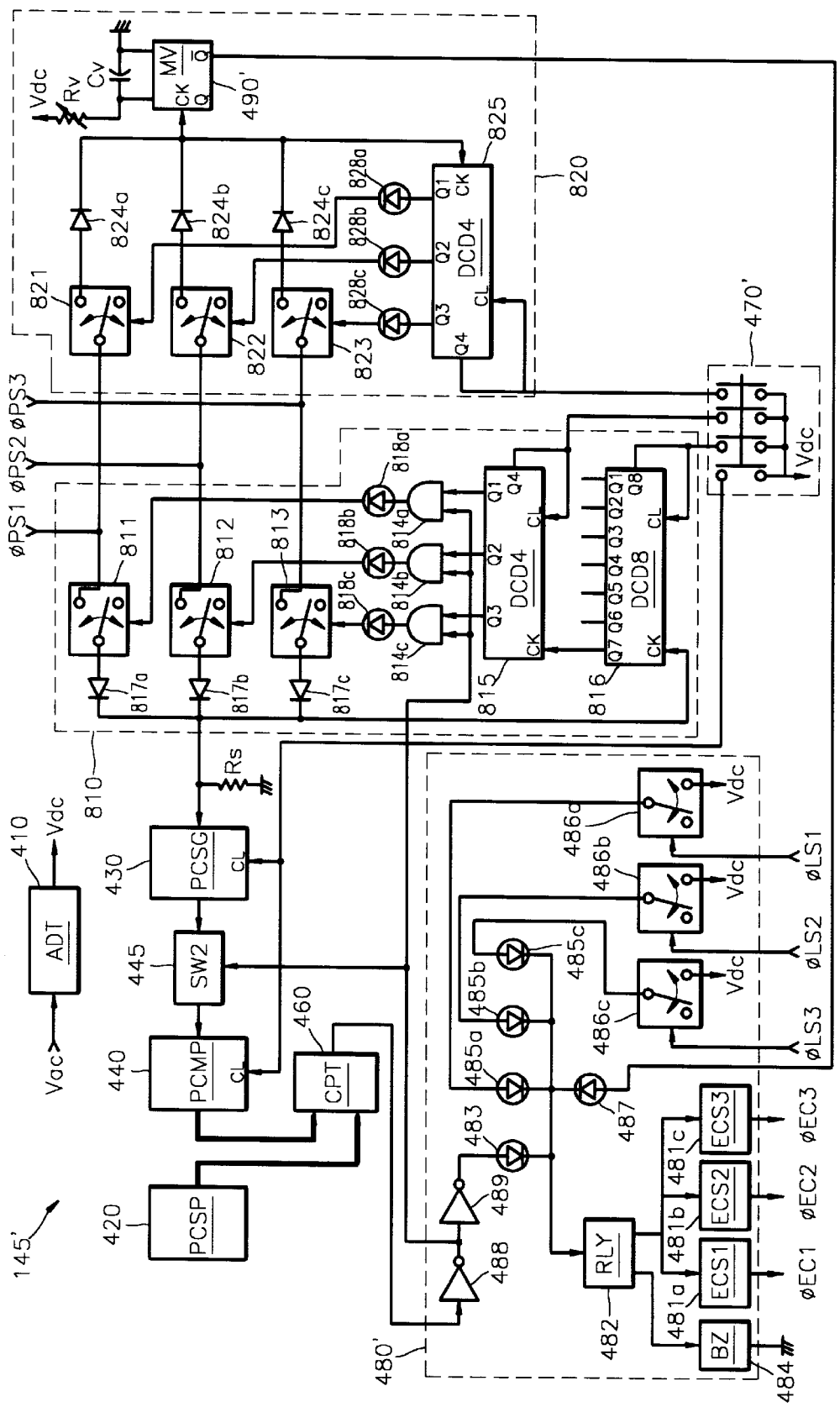
FIG. 9 is a circuit diagram of the controller shown in FIG. 8.

FIG. 9 is a detailed circuit diagram of the controller 145' shown in FIG. 8. Although three units are shown in this example, the number of the pumps and main bodies is not limited to three, and the controller can be modified to be suitable for a semiconductor device manufacturing apparatus comprising any number of pumps and main bodies. In FIGS. 8 and 9, the same reference numbers are used as those in the first preferred embodiment to represent the same elements. Thus, a detailed explanation of the elements illustrated in the first preferred embodiment is omitted.

Referring to FIGS. 8 and 9, the controller 145' comprises a pumping cycle setting portion PCSP 420, a switching portion 810, a pumping cycle signal generator PCSG 430, a second switch 455, a pumping cycle measuring portion PCMP 440, a comparator 460, an alarm unit 480' and a reset switch 470'. Also, the controller 145' may further comprise a pump state sensor (PSS) 820. The PCSP 420, the PCSG 430, the second switch 455, the PCMP 440 and the comparator 460 have the same function and structure as in the first preferred embodiment, and the connection relationship thereof is also the same as in the first preferred embodiment.

The switching portion 810 includes first through third switches 811, 812, and 813, first and second decoders 816 and 815, and first through third AND gates $814_a$ to $814_c$. The first switch 811 is interposed between the first pumping cycle sensor 140$_a$ of FIG. 8 and the PCSG 430; the second switch 812 is interposed between the second pumping cycle sensor 140$_b$ of FIG. 8 and the PCSG 430; and the third switch 813 is interposed between the third pumping cycle sensor 140$_c$ of FIG. 8 and the PCSG 430. The output ports of the first through third switches 811, 812 and 813, which are connected to an input port of the PCSG 430, are connected to an input port, e.g., clock pin (CK) of the first decoder 816. Also, in order to prevent a signal output from one of the first through third switches 811, 812, and 813 from being input to other switches, it is preferable to connect a diode 817$_a$ to 817$_c$ to each output port of the first through third switches 811, 812 and 813.

Preferably, the first decoder 816 preferably comprises at least eight output pins Q1, . . . , Q8. Also, the eighth output pin Q8 of the first decoder 816 is preferably connected to a clear pin CL of the first decoder 816 to initialize the first decoder 816 at a point in time when the signal output via the eighth output pin Q8 changes from the first logic state to the second logic state. The seventh output pin Q7 of the first decoder 816 is preferably connected to an input pin, e.g., clock pin (CK), of the second decoder 815, which has at least four or more output pins Q1, . . . , Q4, and all the first through sixth output pins are preferably floated. The fourth output pin Q4 of the second decoder 815 is preferably connected to a clear pin CL that initializes the second decoder 815. The first output pin Q1 of the second decoder 815 is preferably connected to one input pin of the first AND gate 814$a$ and the second output pin Q2 of the second decoder 815 is connected to one input pin of the second AND gate 814$b$. In the same manner, the third output pin Q3 of the second decoder 815 is connected to one input pin of the third AND gate 814$c$. The remaining input pins of each AND gate 814$a$ to 814$c$ are connected to a first inverter 488 of the alarm unit 480', i.e., to the output port of the first inverter 488, which is directly connected to the output port of the comparator 460. Accordingly, the first through third AND gates 814$a$ to 814$c$ are controlled by the output signal of the first inverter 488. The three output pins of the first through third AND gates 814$a$ to 814$c$ are connected to control ports of the first, second and third switches 811, 812 and 813, respectively.

Preferably, first, second, and third light emitting diodes 818$a$, 818$b$, and 818$c$ are respectively interposed between the three AND gates 814$a$ to 814$c$ and the three switches 811, 812, and 813, such that the operator can visually detect the switches in turned-on state. Also, the reset switch 470' is preferably connected to the clear pins CLs of the first and second decoders 816 and 815 included in the switching portion 810, as well as to the clear pin CL of the PCSG 430 and of the PCMP 440.

Also, the alarm unit 480' preferably further comprises two additional low level sensing switches and two additional end cycle switches beyond the one low level sensing switch and one end cycle switch of the alarm unit 480 shown in FIG. 5. In other words, the alarm unit 480' comprises first through third low level sensing switches 486$a$, 486$b$, and 486$c$ and first through third end cycle switches 481$a$, 481$b$, and 481$c$. Control ports of first through third low level sensing switches 486$a$, 486$b$, and 486$c$ are connected to the first through third low level sensors 150$_a$, 150$_b$, and 150$_c$ respectively attached to the first through third tanks 110$_a$, 110$_b$, and 110$_c$ shown in FIG. 8. Accordingly, the first low level sensing switch 486$a$ controlled by an output signal $\Phi LS_1$ of the first low level sensor 150$_a$ and the second low level sensing switch 486$b$ controlled by an output signal $\Phi LS_2$ of the second low level sensor 150$_b$. Similarly, the third low level sensing switch 486$c$ is controlled by an output signal $\Phi LS_3$ of the third low level sensor 150$_c$.

An output signal $\Phi EC_1$ of the first end cycle switch 481a controls the operation of the first main body 130$_a$ shown in FIG. 8, and an output signal $\Phi EC_2$ of the second end cycle switch 481$b$ controls the operation of the second main body 130$_b$. Similarly the output signal $\Phi EC_3$ of the third end cycle switch 481$c$ controls the operation of the third main body 130$_c$. Also, the alarm unit 480' may further comprise three light emitting diodes 485$a$, 485$b$, and 485$c$, respectively between the relay switch 482 and the low level sensing switches 486$a$, 486$b$ and 486$c$ to allow the operator to visually detect a shortage of the chemical solution in the tanks.

The controller 145' may also comprise a pump state sensor 820. The pump state sensor 820 includes fourth through sixth switches 821, 822, and 823, a third decoder 825 and a multi-vibrator 490'. Preferably, the multi-vibrator 490' is a triggerable multi-vibrator, and the third decoder 825 has at least four output pins. The fourth through sixth switches 821, 822 and 823 are connected to the first through third pumping cycle sensors 140$_a$, 140$_b$, and 140$_c$, respectively as are the first through third switches 811, 812 and 813 included in the switching portion 810. All output pins of the fourth through sixth switches 821, 822 and 823 are connected to an input pin, e.g., clock pin (CK), of the third decoder 825 and an input pin, e.g., clock pin (CK) of the multi-vibrator. An output pin Q4 of the third decoder 825 is connected to a clear pin CL, and first through third output pins Q1, Q2 and Q3 are connected to control ports of the fourth, fifth, and sixth switches 821, 822 and 823, respectively. Also, it is preferable to connect a diode 824$a$, 824$b$, or 824$c$ to each output pin of the fourth through sixth switches 821, 822 and 823, so as to prevent an output signal from one of the three switches from inputting to other switches. Also, first through third light emitting diodes 828$a$, 828$b$, and 828$c$ may be connected to the first, second and third output pins Q1, Q2 and Q3 of the decoder 815 respectively such that the operator can visually detect the state of the operating switches, i.e., the turn-on state of the switches.

The multi-vibrator 490' preferably comprises a variable resistor R$_v$ and a capacitor C$_v$ as in the multi-vibrator 490 shown in FIG. 5, to control the pulse width of the output signal. The clear pin CL of the third decoder 825 is preferably connected to the reset switch 470'. An output pin /Q of the multi-vibrator 490' included in the pump state sensor 820 is connected to the relay switch 482 of the alarm unit 480'. Preferably, a light emitting diode 487 is interposed between the multi-vibrator 490' and the relay switch 482, such that the light emitting diode 487 is turned on in addition to the ringing of the alarm when a signal of the first logic state is output via the output pin /Q of the multi-vibrator 490'.

The operation of the controller 145' having the above structure will be described in detail with reference to FIGS. 10A through 10L. FIGS. 10A through 10C represent the signals output from the first through third pumping cycle sensors 140$_a$, 140$_b$, and 140$_c$, and FIG. 10D represents the signal output via the seventh output pin Q7 of the first decoder 816 included in the switching portion 810. Also, FIGS. 10E through 10G represent the signals output via the output pins of the second decoder 815 included in the switching portion 810, FIGS. 10H through 10J represent the signals output via the output pins of the third decoder 825 included in the pump state sensor 820, and FIGS. 10K and 10L represent the signals output via the output pins Q and /Q of the multi-vibrator. Preferably, the logic state of the output signals from the first and second decoders 816 and 815 of the switching portion 810 and the decoder 825 of the pump state sensor 820 are changed when an input signal changes from the first logic state to the second logic state.

The maximum allowable operating period of the pumps 120a, 120b, and 120c is stored in the PCSP 420. Then, all the counters and the decoders of the controller 145' are initialized using the reset switch 470', so that the PCMP 440 displays "0.0" on the second indicator 447 and the first switch 811 of the switching portion 810 and the first switch 821 of the pump state sensor 820 turn on. Accordingly, even if the pumps other than the first pump $120_a$ of FIG. 8, e.g., the second and third pumps $120_b$ and $120_c$, operate, the second and third pulse signals $\Phi PS_2$ and $\Phi PS_3$ are not input to the PCSG 430 and the first decoder 816.

When the sixth pulse signal is generated by the first pumping cycle sensor $140_a$ installed adjacent to the first pump $120_a$, the signal output via the seventh output pin Q7 of the first decoder 816 changes from the second logic state to the first logic state. Subsequently, when the seventh pulse signal is input via the first switch 811 in turned-on state to the first decoder 816, the eighth output pin Q8 of the first decoder 816 outputs a signal of the first logic state to immediately initialize the first decoder 816. Thus, only the first output pin Q1 of the first decoder 816 outputs a signal of the first logic state and only the second output pin Q2 of the second decoder 815 outputs a signal of the first logic state. As a result, the first switch 811 turns off and simultaneously only the second switch 812 is turned on. Here, only the second light emitting diode 818b is turned on.

Then, when the sixth pulse signal (a pulse signal generated by the second pumping cycle sensor $140_b$) of the pulse signals transferred via the second switch 812 in turned-on state is input to the input pin of the first decoder 816, the seventh output pin Q7 of the first decoder 816 outputs a signal of the first logic state. Also, when the seventh pulse signal is input via the second switch 812 to the first decoder 816, the first decoder 816 is initialized and only the output pin Q3 of the second decoder 815 outputs a signal of the first logic state. As a result, the second switch 812 is turned off and only the third switch 813 is turned on.

Similarly, when the seventh pulse signal from the third pumping cycle sensor $140_c$ is input via the third switch 813 in turned-on state to the first decoder 816, the second decoder 815 is initialized, so that the third switch 813 is turned off and simultaneously the first switch 811 is turned on. As the first, second and third switches 811, 812 and 813 of the switching portion 810 turn on in sequence, the actual pumping cycles of the first, second and third pumps $120_a$, $120_b$, and $120_c$ are displayed in sequence by the PCMP 440.

In addition, the six pulse signals generated successively from a pumping cycle sensor are input in sequence to the PCSG via a switch 817a, 817b, or 817c of the switching portion 810. Accordingly, the PSMP continuously measures the pumping cycle time of each pump three times. The number of output pins of the first decoder 816 of the switching portion 810 relates to the number of continuous measurements of the pumping cycles of one pump. Also, the number of output pins of the second decoder 815 and the number of switches are determined depending on the number of pumps. Thus, the switching portion 810 can be modified to various types.

The pump state sensor 820 controls the alarm unit 480' to generate an alarm if at least one of a plurality of pumps, e.g., three pumps $120_a$, $120_b$, and $120_c$, malfunctions. In detail, when one of the three pumps $120_a$, $120_b$, and $120_c$ suddenly stops, the pumping cycle measuring portion PCMP 440 displays the last measured pumping cycle. Here, if the last pumping cycle is shorter than the pumping cycle stored in the PCSP 420, the alarm unit 480' does not generate an alarm. Thus, if the operator does not observe carefully the pumping cycle displayed on the second display 447 of the PCMP 440, it is difficult to check whether the chemical mechanical polishing apparatus is operating normally. The pump state sensor 820 can solve this problem.

The operation of the pump state sensor 820 will be described in detail with reference to FIG. 9, FIGS. 10A through 10C and FIGS. 10H through 10L.

Firstly, when the third decoder 825 of the pump state sensor 820 is initialized by the reset switch 470', only the first output pin Q1 of the third decoder 825 outputs a signal of the first logic state, so only the fourth switch 821 is turned on. When the fourth switch 821 is turned on and the first pumping cycle sensor $140_a$ generates a pulse signal, only the second output pin Q2 of the third decoder 825 outputs a signal of the first logic state. As a result, the fourth switch 821 is turned off and the fifth switch 822 is turned on. When the fifth switch 822 is turned on and the second pumping cycle sensor $140_b$ generates a pulse signal, only the sixth output pin Q3 of the third decoder 825 outputs a signal of the first logic state. As a result, the fifth switch 822 is turned off and the sixth switch 823 is turned on. Subsequently, when the sixth switch 823 is turned on and the third pumping cycle sensor $140_c$ generates a pulse signal, the fourth output pin Q4 of the third decoder 825 outputs a signal of the first logic state, so the third decoder 825 is initialized. As a result, only the first output pin Q1 of the third decoder 825 outputs a signal of the first logic state, so only the fourth switch 821 is turned on.

As described above, the pump state sensor 820 senses the operation of three pumps $120_a$, $120_b$, and $120_c$ in sequence. Here, the multi-vibrator 490' of the pump state sensor 820 outputs a signal of the first logic state for a predetermined time $T_{osc}$ whenever three pumping cycle sensors $140_a$, $140_b$, and $140_c$ generate pulse signals in sequence. The predetermined time $T_{osc}$ can be adjusted using a variable resistance $R_v$. Here, the predetermined time $T_{osc}$ must be longer than the pumping cycle stored in the PCSP 420. Thus, when the-operating cycle of each pump is shorter than or equal to the predetermined time $T_{osc}$, one of two output pins Q and /Q of the multi-vibrator 490', e.g., output pin Q, shows the first logic state. However, when the operating cycle of one of the three pumps $120_a$, $120_b$, and $120_c$ is longer than the predetermined time $T_{osc}$, the output pin Q of the multi-vibrator 490' outputs a signal of the second logic state. For example, when a first pulse signal $\Phi PS_1$ is generated by the first pumping cycle sensor $140_a$ and the second pump $120_b$ stops at a point of time $T_h$, the second output pin Q2 of the third decoder 825 of the pump state sensor 820 shows the first logic state continuously. Also, if the second pump $120_b$ no loner generates a pulse signal until the predetermined time $T_{osc}$ passes after the second output pin Q2 outputs a signal of the first logic state, the output pin Q of the multi-vibrator 490' outputs a signal of the second logic state. Accordingly, the other output pin /Q that outputs a logic state opposite to that of the output pin Q outputs a signal of the first logic state when the second pump $120_b$ stops, so the alarm unit 480' generates alarm signal.

As described above, the semiconductor device manufacturing apparatus according to the present invention can automatically detect the filtering function of the filter and the operating state of the pump. Thus, an operator can manage efficiently the filter and pump in the clean room area without going in and out of the service area at all times. Also, it is possible to accurately detect the timing for replacing the filter and prevent the sudden stoppage of the process.

While the present invention has been illustrated and described with reference to specific embodiments, further modifications and alterations within the spirit and scope of this invention as defined by the appended claims will occur to those skilled in the art.

What is claimed is:

1. A conductor device manufacturing apparatus comprising:
   a tank having an inlet and an outlet, for storing a chemical solution;
   a pump interposed between the inlet and outlet of the tank, for circulating the chemical solution contained in the tank;
   a filter interposed between the pump and the inlet of the tank;
   at least one main body connected to an outlet of the filter;
   a pumping cycle sensor for monitoring the pumping operation of the pump and generating a pulse signal indicative of a cycle time during the pumping operation; and
   a controller for measuring the cycle time of the pulse signal to determine the level of deterioration of the filter.

2. A semiconductor device manufacturing apparatus, as recited in claim 1, wherein the chemical solution is a slurry.

3. A semiconductor device manufacturing apparatus, as recited in claim 1, wherein the at least one main body is a chemical mechanical polisher (CMP).

4. A semiconductor device manufacturing apparatus, as recited in claim 1, wherein the pump is a diaphragm pump having an air outlet and an air inlet.

5. A semiconductor device manufacturing apparatus, comprising:
   a tank having an inlet and an outlet, for storing a chemical solution;
   a pump interposed between the inlet and outlet of the tank, for circulating the chemical solution contained in the tank;
   a filter interposed between the pump and the inlet of the tank;
   at least one main body connected to an outlet of the filter;
   a pumping cycle sensor for monitoring the pumping operation of the pump and generating a pulse signal indicative of a cycle time during the pumping operation; and
   a controller for measuring the cycle time of the pulse signal to determine the level of deterioration of the filter,
   wherein the pump is a diaphragm pump having an air outlet and an air inlet, and
   wherein the pumping cycle sensor comprises:
      a switch installed in front of the air outlet of the pump, the switch having a button supported by a spring; and
      a panel installed between the button of the switch and the air outlet of the pump, one end of the panel being connected to the body of the switch by a hinge.

6. A semiconductor device manufacturing apparatus, comprising:
   a tank having an inlet and an outlet, for storing a chemical solution;
   a pump interposed between the inlet and outlet of the tank, for circulating the chemical solution contained in the tank;
   a filter interposed between the pump and the inlet of the tank;
   at least one main body connected to an outlet of the filter;
   a pumping cycle sensor for monitoring the pumping operation of the pump and generating a pulse signal indicative of a cycle time during the pumping operation; and
   a controller for measuring the cycle time of the pulse signal to determine the level of deterioration of the filter, wherein the controller comprises:
      a pumping cycle setting portion for storing the maximum allowable operating period of the pump;
      a pumping cycle signal generator for outputting a toggle signal, the state of the toggle signal changing whenever a pulse signal is generated by the pumping cycle sensor;
      a pumping cycle measuring portion for measuring the operating cycle time of the pump using the toggle signal output from the pumping cycle signal generator as an input signal;
      a comparator for comparing a first output signal from the pumping cycle setting portion with a second output signal from the pumping cycle measuring portion;
      a first switch interposed between the pumping cycle sensor and the pumping cycle signal generator;
      a second switch interposed between the pumping cycle signal generator and the pumping cycle measuring portion;
      an alarm unit for generating an alarm and simultaneously opening the first and second switches when the measured operating cycle time of the pump is equal to the maximum allowable operating period of the pump stored in the pumping cycle setting portion, to stop the operation of the pumping cycle signal generator and the pumping cycle measuring portion; and
      a reset switch for initializing the pumping cycle signal generator and the pumping cycle measuring portion.

7. A semiconductor device manufacturing apparatus, as recited in claim 6, further comprising a multi-vibrator connected to an output port of the first switch, the multi-vibrator activating the alarm unit when the operating cycle time of the pump is longer than a predetermined duration.

8. A semiconductor device manufacturing apparatus, as recited in claim 7, wherein the multi-vibrator is a triggerable multi-vibrator.

9. A semiconductor device manufacturing apparatus, as recited in claim 6, wherein the pumping cycle setting portion comprises:
   a first oscillator for generating successive first pulse signals;
   a first counter for counting the number of first pulse signals generated by the first oscillator and generating a first pulse output signal;
   a first decoder for changing the first pulse output signal into a first decimal output signal;
   a first indicator for receiving the first decimal output signal and displaying a decimal number corresponding to the first pulse output signal from the first decoder; and
   at least one counter switch interposed between the first oscillator and the first counter, for transferring a desired number of first pulse signals generated by the first oscillator to the first counter.

10. A semiconductor device manufacturing apparatus, as recited in claim 9, wherein the first counter is an up/down counter.

11. A semiconductor device manufacturing apparatus, as recited in claim 9, wherein the first indicator comprises at least one seven-segment display unit.

12. A semiconductor device manufacturing apparatus, as recited in claim 6, wherein the pumping cycle measuring portion comprises:
    a second oscillator for generating successive second pulse signals with a predetermined cycle time when the toggle signal output from the pumping cycle signal generator is in a first state, and generating a signal of logic "0" when the toggle signal output from the pumping cycle signal generator is in a second state;
    a second counter for counting the number of the second pulse signals output from the second oscillator and generating a second pulse output signal;
    a second decoder for changing the second pulse output signal into a second decimal output signal; and
    a second indicator for receiving the second decimal output signal and displaying a decimal number corresponding to the second pulse output signal from the second decoder.

13. A semiconductor device manufacturing apparatus, as recited in claim 12, wherein the second indicator comprises at least one seven-segment display.

14. A semiconductor device manufacturing apparatus, as recited in claim 12, further comprising a time delay circuit interposed between the reset switch and the second counter.

15. A semiconductor device manufacturing apparatus, as recited in claim 6, wherein the comparator outputs a signal at a first logic state when the output signal from the pumping cycle setting portion is equal to the output signal from the pumping cycle measuring portion, and outputs a signal at a second logic state when the output signal from the pumping cycle setting portion is different to the output signal from the pumping cycle measuring portion.

16. A semiconductor device manufacturing apparatus, as recited in claim 6, wherein the alarm unit comprises:
    a first inverter connected to an output port of the comparator, for outputting a first compared signal controlling the on/off state of the first and second switches;
    a second inverter connected to the output port of the first inverter for outputting a second compared signal;
    a relay switch connected to the output port of the second inverter, the relay switch comprising first and second relay switches that can be operated at the same time;
    a buzzer connected to the first relay switch; and
    an end cycle switch interposed between the second relay switch and the at least one main body.

17. A semiconductor device manufacturing apparatus, as recited in claim 16, further comprising a pumping cycle sensing lamp interposed between the second inverter and the relay switch.

18. A semiconductor device manufacturing apparatus, as recited in claim 1, further comprising at least one level sensor on the sidewall of the tank, the level sensor for sensing the level of the chemical solution contained in the tank.

19. A semiconductor device manufacturing apparatus, as recited in claim 18, wherein the level sensor is a low level sensor attached to the lower sidewall of the tank.

20. A semiconductor device manufacturing apparatus, comprising:
    a tank having an inlet and an outlet, for storing a chemical solution;
    a pump interposed between the inlet and outlet of the tank, for circulating the chemical solution contained in the tank;
    a filter interposed between the pump and the inlet of the tank;
    at least one main body connected to an outlet of the filter;
    a pumping cycle sensor for monitoring the pumping operation of the pump and generating a pulse signal indicative of a cycle time during the pumping operation;
    at least one level sensor on the sidewall of the tank, the level sensor for sensing the level of the chemical solution contained in the tank; and
    a controller for measuring the cycle time of the pulse signal to determine the level of deterioration of the filter, wherein the controller comprises:
        a pumping cycle setting portion for storing the maximum allowable operating period of the pump;
        a pumping cycle signal generator for outputting a toggle signal, the state of the toggle signal changing whenever a pulse signal is generated by the pumping cycle sensor;
        a pumping cycle measuring portion for measuring the operating cycle time of the pump using the toggle signal output from the pumping cycle signal generator as an input signal;
        a comparator for comparing a first output signal from the pumping cycle setting portion to a second output signal from the pumping cycle measuring portion;
        a first switch interposed between the pumping cycle sensor and the pumping cycle signal generator;
        a second switch interposed between the pumping cycle signal generator and the pumping cycle measuring portion; and
        an alarm unit for generating an alarm and simultaneously opening the first and second switches when the measured operating cycle time of the pump is equal to the maximum allowable operating period stored in the pumping cycle setting portion, to stop the operation of the pumping cycle signal generator and the pumping cycle measuring portion, and for generating an alarm when the level of the chemical solution in the tank is lower than the height of the low level sensor.

21. A semiconductor device manufacturing apparatus, as recited in claim 20, further comprising a multi-vibrator connected to a first output port of the first switch, the multi-vibrator operating the alarm unit when the operating cycle time of the pump is longer than a predetermined duration.

22. A semiconductor device manufacturing apparatus, as recited in claim 21, wherein the multi-vibrator is a triggerable multi-vibrator.

23. A semiconductor device manufacturing apparatus, as recited in claim 20, wherein the alarm unit comprises:
    a first inverter connected to the output port of the comparator, for outputting a first compared signal controlling the on/off state of the first and second switches;
    a second inverter connected to the output port of the first inverter, for outputting a second compared signal;
    a relay switch connected to the output port of the second inverter, the relay switch comprising first and second relay switches that may be operated at the same time;
    a buzzer connected to the first relay switch;

an end cycle switch interposed between the second relay switch and the at least one main body; and at least one low level sensing switch interposed in parallel between the relay circuit and a power source, the low level sensing switch being controlled by a signal from the at least one level sensor.

24. A semiconductor device manufacturing apparatus, as recited in claim 23, further comprising a pumping cycle sensing lamp interposed between the second inverter and the relay switch.

25. A semiconductor device manufacturing apparatus, as recited in claim 24, further comprising at least one chemical solution sensing lamp interposed in parallel between at least one of the low level sensing switches and the relay switch.

26. A semiconductor device manufacturing apparatus comprising:

a plurality of tanks for storing a plurality of chemical solutions, each tank having an outlet and an inlet;

a plurality of pumps, each interposed between the inlet and outlet of a corresponding one of the plurality of tanks, for circulating the chemical solutions contained in the tanks;

a plurality of filters, each interposed between the outlet of each of a corresponding one of the plurality of pumps and the inlet of a corresponding one of the plurality of tanks;

a plurality of main bodies, each connected to the outlet of a corresponding one of the filters;

a plurality of pumping cycle sensors for changing the pumping operation of a corresponding pump into a plurality of pulse signals; and a controller for measuring cycle times of the plurality of pulse signals generated by the plurality of pumping cycle sensors to determine the level of deterioration of the plurality of filters.

27. A semiconductor device manufacturing apparatus, as recited in claim 26, wherein the chemical solution is a slurry.

28. A semiconductor device manufacturing apparatus, as recited in claim 26, wherein each main body is a chemical mechanical polisher (CMP).

29. A semiconductor device manufacturing apparatus, as recited in claim 26, wherein each of the plurality of pumps is a diaphragm pump having an air outlet and an air inlet.

30. A semiconductor device manufacturing apparatus, as recited in 29, wherein each pumping cycle sensor comprises:

a switch installed in front of the air outlet of one of the plurality of pumps, the switch having a button supported by a spring; and a panel installed between the button of the switch and the air outlet of the one of the plurality of pumps, one end of the panel being connected to the body of the switch by a hinge.

31. A semiconductor device manufacturing apparatus, comprising:

a plurality of tanks for storing a plurality of chemical solutions, each tank having an outlet and an inlet;

a plurality of pumps, each interposed between the inlet and outlet of a corresponding one of the plurality of tanks, for circulating the chemical solutions contained in the tanks;

a plurality of filters, each interposed between the outlet of each of a corresponding one of the plurality of pumps and the inlet of a corresponding one of the plurality of tanks;

a plurality of main bodies, each connected to the outlet of a corresponding one of the filters;

a plurality of pumping cycle sensors for changing the pumping operation of a corresponding pump into a plurality of pulse signals; and a controller for measuring cycle times of the plurality of pulse signals generated by the plurality of pumping cycle sensors to determine the level of deterioration of the plurality of filters, wherein the controller comprises:

a pumping cycle setting portion for storing the maximum allowable operating period of each pump;

a first switching portion for outputting in sequence the plurality of pulse signals generated by the plurality of pumping cycle sensors;

a pumping cycle signal generator for outputting a toggle signal, the state of the toggle signal changing whenever a pulse signal is input from the first switching portion;

a pumping cycle measuring portion for measuring the operating cycle time of each pump using the toggle signal output from the pumping cycle signal generator as an input signal;

a comparator for comparing an output signal from the pumping cycle setting portion with an output signal from the pumping cycle measuring portion;

a second switching portion interposed between the pumping cycle signal generator and the pumping cycle measuring portion;

a reset switch for initializing the first switching portion, the pumping cycle signal generator and the pumping cycle measuring portion; and an alarm unit for generating an alarm and simultaneously turning off the first switching portion and the second switching portion when the measured operating cycle time of the pump is equal to the maximum allowable operating period stored in the pumping cycle setting portion, to stop the operation of the pumping cycle signal generator and the pumping cycle measuring portion.

32. A semiconductor device manufacturing apparatus, as recited in claim 31, further comprising a pump state sensor for operating the alarm unit when at least one of the pulse signals output from the plurality of pumping cycle sensors has a cycle time longer than a predetermined time.

33. A semiconductor device manufacturing apparatus, as recited in claim 32, wherein the pump state sensor is initialized by the reset switch.

34. A semiconductor device manufacturing apparatus, as recited in 32, wherein the pump state sensor comprises:

a plurality of state sensor switches connected one-to-one with each of the pumping cycle sensors;

a decoder, using one of the plurality of pulse signals output via one of the plurality of state sensor switches as an input signal, for turning off one of the plurality of state sensor switches and simultaneously turning on another switch, so as to turn on in sequence all of the plurality of state sensor switches; and a triggerable multi-vibrator for outputting a signal operating the alarm unit when one of the plurality of pulse signals received from one of the plurality switches has a cycle time longer than a predetermined time.

35. A semiconductor device manufacturing apparatus, as recited in claim 31, wherein the first switching portion comprises:

a plurality of signal switches connected one-to-one with each of the pumping cycle sensors;

a first decoder for outputting a pulse signal whenever the one of the plurality of pulse signals output via one of the plurality of signal switches in a closed state is input at least two times; and a second decoder for outputting a control signal turning on in sequence all of the plurality of signal switches by turning off a currently-closed one of the signal switches using one of the plurality of pulse signals output from the first decoder as an input signal and by simultaneously turning on another one of the plurality of signal switches.

36. A semiconductor device manufacturing apparatus, as recited in claim 35, wherein the plurality of signal switches of the first switching portion are turned off completely when the maximum allowable operating period stored in the pumping cycle setting portion is equal to the pumping cycle time measured by the pumping cycle measuring portion.

* * * * *